(12) United States Patent
Kim et al.

(10) Patent No.: US 8,861,268 B2
(45) Date of Patent: Oct. 14, 2014

(54) MULTI-VALUED LOGIC DEVICE HAVING NONVOLATILE MEMORY DEVICE

(75) Inventors: Ho-jung Kim, Suwon-si (KR); Joong-ho Choi, Seoul (KR); Jai-kwang Shin, Anyang-si (KR); Hyun-sik Choi, Hwaseong-si (KR)

(73) Assignees: Samsung Electronics Co., Ltd., Gyeonggi-Do (KR); University of Seoul Foundation of Industry Academic Cooperation, Seoul (KR)

( * ) Notice: Subject to any disclaimer, the term of this patent is extended or adjusted under 35 U.S.C. 154(b) by 79 days.

(21) Appl. No.: 13/564,878

(22) Filed: Aug. 2, 2012

(65) Prior Publication Data

US 2013/0121059 A1    May 16, 2013

(30) Foreign Application Priority Data

Nov. 16, 2011  (KR) .................. 10-2011-0119776

(51) Int. Cl.
*G11C 16/12* (2006.01)
*G11C 16/30* (2006.01)
*G11C 11/56* (2006.01)
*G11C 16/10* (2006.01)
*G11C 16/34* (2006.01)

(52) U.S. Cl.
CPC ............. *G11C 16/10* (2013.01); *G11C 16/30* (2013.01); *G11C 11/5628* (2013.01); *G11C 16/34* (2013.01); *G11C 16/3404* (2013.01)
USPC ................................ 365/185.03; 365/185.21

(58) Field of Classification Search
USPC ............. 365/185.03, 185.08, 185.21, 185.18
See application file for complete search history.

(56) References Cited

U.S. PATENT DOCUMENTS

| 6,473,340 B1 * | 10/2002 | Pasotti et al. ............ 365/185.21 |
| 6,487,685 B1 * | 11/2002 | Stuart Fiske et al. ......... 714/701 |
| 2012/0155166 A1 * | 6/2012 | Li ............................ 365/185.03 |
| 2012/0212255 A1 | 8/2012 | Jeong et al. |
| 2013/0121059 A1 * | 5/2013 | Kim et al. ..................... 365/148 |

FOREIGN PATENT DOCUMENTS

| JP | 2008-085770 A | 4/2008 |
| KR | 20080040426 A | 5/2008 |
| KR | 20080067834 A | 7/2008 |
| KR | 101026634 B1 | 4/2011 |

* cited by examiner

*Primary Examiner* — Andrew Q Tran
(74) *Attorney, Agent, or Firm* — Harness, Dickey & Pierce, P.L.C.

(57) ABSTRACT

A multi-valued logic device having an improved reliability includes a conversion unit configured to convert a multi level signal into a plurality of partial signals; and a plurality of nonvolatile memory devices configured to individually store the plurality of partial signals, wherein a number of bits of each of the plurality of partial signals individually stored in the plurality of nonvolatile memory devices is less than the number of bits of the multi level signal.

35 Claims, 13 Drawing Sheets

W=1(WRITE) & RESET

W=1(WRITE) & SET

/W1=(READ)

MULTI-VALUED LOGIC DEVICE HAVING NONVOLATILE MEMORY DEVICE

CROSS-REFERENCE TO RELATED APPLICATIONS

This application claims the benefit of Korean Patent Application No. 10-2011-0119776, filed on Nov. 16, 2011, in the Korean Intellectual Property Office, the disclosure of which is incorporated herein in its entirety by reference.

BACKGROUND

1. Field

At least one example embodiment relates to multi-valued logic devices, and more particularly, to multi-valued logic devices having a nonvolatile memory device.

2. Description of the Related Art

Since a multi-valued logic device requires large numbers of flip-flops and latches in order to process a multi level signal, the size of a logic circuit and the amount of power consumption are increased. Furthermore, if a memory device is used to store multi level data, the reliability of the memory device may be reduced and a memory device having a large number of levels exceeding 3 bits may not be easily implemented.

SUMMARY

Provided are easily implementable and reliable multi-valued logic devices.

Additional aspects will be set forth in part in the description which follows and, in part, will be apparent from the description, or may be learned by practice of example embodiments.

According to an example embodiment, a multi-valued logic device includes a conversion unit configured to convert a multi level signal into a plurality of partial signals; and a plurality of nonvolatile memory devices configured to individually store the plurality of partial signals, wherein the number of bits of each of the plurality of partial signals individually stored in the plurality of nonvolatile memory devices is less than the number of bits of the multi level signal.

In at least one example embodiment, each of the plurality of partial signals may be a 1-bit signal, and each of the plurality of nonvolatile memory devices may be a single level cell (SLC) nonvolatile memory device configured to store the 1-bit signal.

In at least one example embodiment, the multi-valued logic device may further include a write unit configured to store the plurality of partial signals individually in the plurality of nonvolatile memory devices according to the write signal.

In at least one example embodiment, the multi-valued logic device may further include a control unit configured to generate the write signal and transmit the write signal to the write unit, the write signal varying resistances of the plurality of nonvolatile memory devices based on the plurality of partial signals.

In at least one example embodiment, the write unit may include a plurality of voltage applying units connected to the plurality of nonvolatile memory devices, and the plurality of voltage applying units may be configured to individually vary resistances of the plurality of nonvolatile memory devices.

In at least one example embodiment, each of the plurality of voltage applying units may include a first state voltage applying unit configured to vary a resistance of each of the plurality of nonvolatile memory devices to a first state; and a second state voltage applying unit configured to vary the resistance of each of the plurality of nonvolatile memory devices to a second state.

In at least one example embodiment, the multi-valued logic device may further include a read unit configured to output the multi level signal according to a read signal.

In at least one example embodiment, the read unit may include a plurality of current generating units individually connected to the plurality of nonvolatile memory devices, and each of the plurality of current generating units may be configured to output a part of the multi level signal based on each of the plurality of partial signals stored in the plurality of nonvolatile memory devices.

In at least one example embodiment, each of the plurality of current generating units may be connected between an output terminal of the read unit and each of the plurality of nonvolatile memory devices.

In at least one example embodiment, each of the plurality of current generating units may include a current mirror circuit configured to output the part of the multi level signal based on a current flowing in each of the plurality of nonvolatile memory devices.

In at least one example embodiment, the plurality of nonvolatile memory devices may be aligned in an array.

In at least one example embodiment, the conversion unit may include a comparison unit configured to generate a plurality of period signals, the period signals corresponding to boundaries between levels of the multi level signal; and a decoder configured to generate the plurality of partial signals based on the plurality of period signals.

In at least one example embodiment, the plurality of partial signals may be binary signals, and the decoder may include a binary decoder configured to generate the binary signals based on the plurality of period signals.

In at least one example embodiment, the multi-valued logic device may further include a level restoring unit configured to restore and outputting the multi level signal by using the plurality of period signals.

In at least one example embodiment, the level restoring unit may be configured to be activated according to a clock signal so as to output the multi level signal.

In at least one example embodiment, the level restoring unit may include a current mirror circuit configured to output the multi level signal based on a current flowing according to the plurality of period signals.

According to another example embodiment, a multi-valued logic device includes a first nonvolatile memory device configured to store a first partial signal corresponding to a first part of a multi level signal; and a second nonvolatile memory device configured to store a second partial signal corresponding to a second part of the multi level signal, wherein a number of bits of each of the first and second partial signals is less than the number of bits of the multi level signal.

In at least one example embodiment, each of the first and second partial signals may be a 1-bit signal, and each of the first and second nonvolatile memory devices may be a single level cell (SLC) nonvolatile memory device for storing the 1-bit signal.

In at least one example embodiment, the multi-valued logic device may further include a conversion unit configured to convert the multi level signal into the first and second partial signals; and a write unit configured to store the first and second partial signals individually in the first and second nonvolatile memory devices according to the write signal.

In at least one example embodiment, the write unit may include a first voltage applying unit configured to store the first partial signal in the first nonvolatile memory device; and a second voltage applying unit configured to store the second partial signal in the second nonvolatile memory device.

In at least one example embodiment, the first voltage applying unit may include a first set voltage applying unit configured to vary a resistance of the first nonvolatile memory device into a set resistance; and a first reset voltage applying unit configured to vary the resistance of the first nonvolatile memory device into a reset resistance, and the second voltage applying unit may include a second set voltage applying unit configured to vary a resistance of the second nonvolatile memory device into a set resistance; and a second reset voltage applying unit configured to vary the resistance of the second nonvolatile memory device into a reset resistance.

In at least one example embodiment, if the first partial signal is in a low state, the first reset voltage applying unit may be activated and thus the resistance of the first nonvolatile memory device may be varied into a reset resistance, if the first partial signal is in a high state, the first set voltage applying unit may be activated and thus the resistance of the first nonvolatile memory device may be varied into a set resistance, if the second partial signal is in a low state, the second reset voltage applying unit may be activated and thus the resistance of the second nonvolatile memory device may be varied into a reset resistance, and, if the second partial signal is in a high state, the second set voltage applying unit may be activated and the resistance of the second nonvolatile memory device may be varied into a set resistance.

In at least one example embodiment, the multi-valued logic device may further include a read unit configured to output the multi level signal according to the read signal.

In at least one example embodiment, the read unit may include a first current generating unit configured to output the first part of the multi level signal based on the first partial signal stored in the first nonvolatile memory device; and a second current generating unit configured to output the second part of the multi level signal based on the second partial signal stored in the second nonvolatile memory device.

In at least one example embodiment, the first current generating unit may be connected between an output terminal of the read unit and the first nonvolatile memory device, and the second current generating unit may be connected between the output terminal of the read unit and the second nonvolatile memory device.

In at least one example embodiment, the first current generating unit may include a first current mirror circuit configured to output the first part of the multi level signal based on a current flowing in the first nonvolatile memory device, and the second current generating unit may include a second current mirror circuit configured to output the second part of the multi level signal based on a current flowing in the second nonvolatile memory device.

According to another example embodiment, a multi-valued logic device includes a first nonvolatile memory device configured to store a first partial signal corresponding to a first part of a first multi level signal; a second nonvolatile memory device configured to store a second partial signal corresponding to a second part of the first multi level signal, a third nonvolatile memory device configured to store a third partial signal corresponding to a first part of a second multi level signal; and a fourth nonvolatile memory device configured to store a fourth partial signal corresponding to a second part of the second multi level signal, wherein a number of bits of each of the first and second partial signals is less than the number of bits of the first multi level signal, and wherein a number of bits of each of the third and fourth partial signals is less than the number of bits of the second multi level signal.

In at least one example embodiment, the first through fourth nonvolatile memory devices may be aligned in a form of an array.

In at least one example embodiment, the multi-valued logic device may further include a write unit configured to store the first through fourth partial signals individually in the first through fourth nonvolatile memory devices according to the write signal and the selection signal.

In at least one example embodiment, the write unit may store the first and second partial signals individually in the first and second nonvolatile memory devices if the selection signal is in a first state, and may store the third and fourth partial signals individually in the third and fourth nonvolatile memory devices if the selection signal is in a second state.

In at least one example embodiment, the multi-valued logic device may further include a read unit configured to output one of the first and second multi level signals selected according to the selection signal, according to the read signal.

In at least one example embodiment, the read unit may include a first current generating unit configured to output the first part of the first multi level signal or the first part of the second multi level signal based on the first partial signal stored in the first nonvolatile memory device or the third partial signal stored in the third nonvolatile memory device; and a second current generating unit configured to output the second part of the first multi level signal or the second part of the second multi level signal based on the second partial signal stored in the second nonvolatile memory device or the fourth partial signal stored in the fourth nonvolatile memory device.

In at least one example embodiment, if the selection signal is in a first state, then the first current generating unit may output the first part of the first multi level signal based on the first partial signal stored in the first nonvolatile memory device, and the second current generating unit may output the second part of the first multi level signal based on the second partial signal stored in the second nonvolatile memory device, and, if the selection signal is in a second state, the first current generating unit may output the third part of the second multi level signal based on the third partial signal stored in the third nonvolatile memory device, and the second current generating unit may output the fourth part of the second multi level signal based on the fourth partial signal stored in the fourth nonvolatile memory device.

In at least one example embodiment, the multi-valued logic further comprises: a write unit configured to store the plurality of partial signals in the plurality of memory devices; a read unit configured to combine the plurality of partial signals to output the multi level signal; and a control unit configured to control the write unit and the read unit based on the plurality of partial signals.

In at least one example embodiment, the write unit is configured to vary resistances of the plurality of memory devices based on the plurality of partial signals.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION OF EXAMPLE EMBODIMENTS

Figure 1:
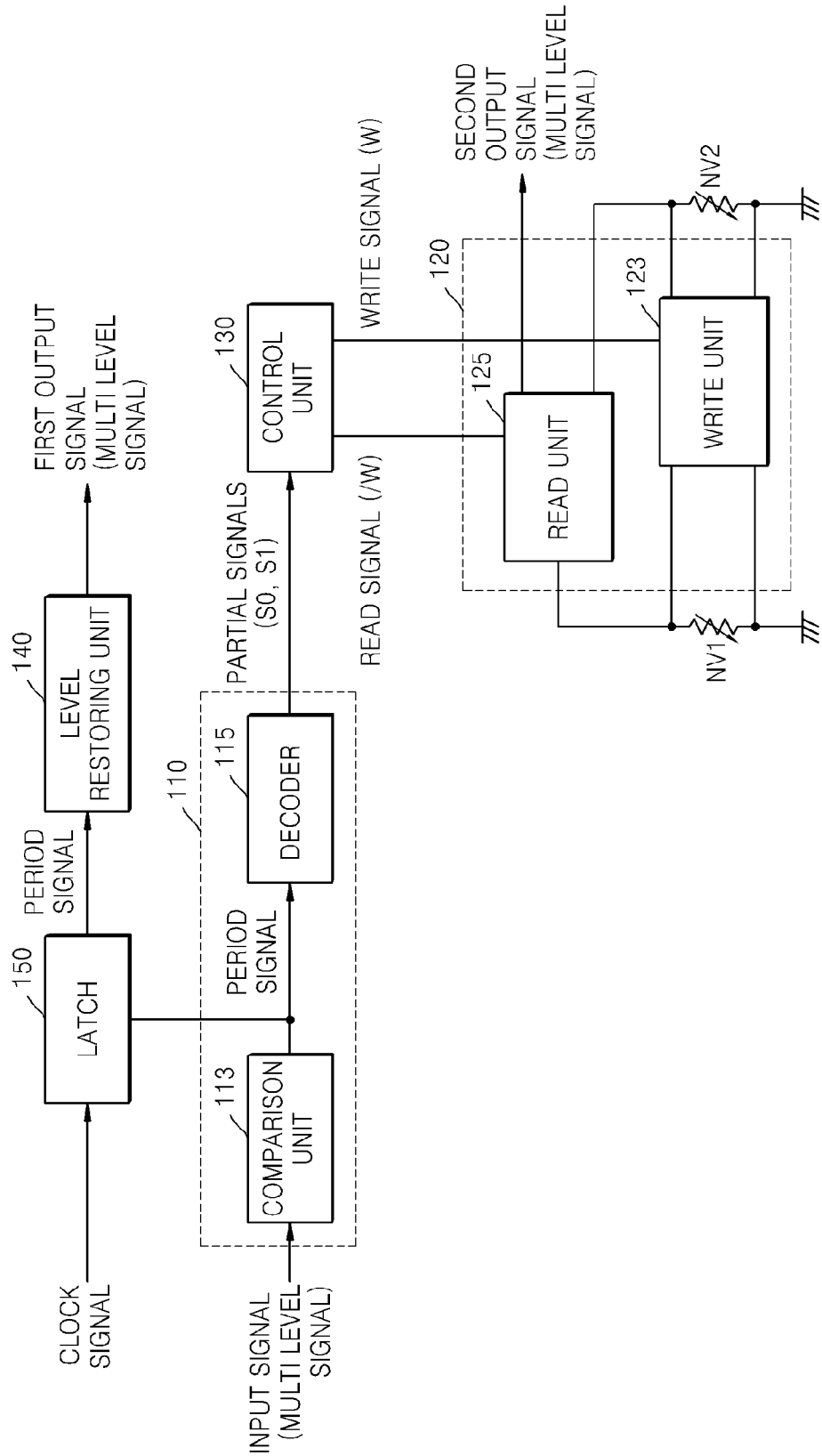
FIG. 1 is a block diagram of a multi-valued logic device according to an example embodiment.

Reference will now be made in detail to example embodiments, which are illustrated in the accompanying drawings, wherein like reference numerals refer to the like elements throughout. In this regard, example embodiments may have different forms and should not be construed as being limited to the descriptions set forth herein. Accordingly, the embodiments are merely described below, by referring to the figures, to explain aspects of the example embodiments.

Terms used in the example embodiments set forth herein may have meanings that have been commonly known in the art. For example, at least one may mean one or more, or one or a plurality of numbers.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the scope of example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

In the following specification, a multi-valued logic device may be defined as a device for processing a signal having three or more levels (hereinafter referred to as a 'multi level signal'). That is, a multi-valued logic device according to an example embodiment may be defined as a device for processing a multi level signal having a number of levels greater than two, i.e., the number of levels (e.g., a high level and a low level) of a signal processed by a two-valued logic device.

Also, in the following specification, storing a signal in a nonvolatile memory device may refer to storing of a current signal flowing in a nonvolatile memory device. For example, a resistance of nonvolatile memory device varies into a high or low resistance according to a voltage applied to the nonvolatile memory device. In this case, if a desired (or alternatively, predetermined voltage) is applied to the nonvolatile memory device, a current flowing in the nonvolatile memory device may be varied into a low or high current.

In order to store a high state signal in a nonvolatile memory device, the resistance of the nonvolatile memory device has to be varied to a low resistance state. If a desired (or alternatively, predetermined) voltage is applied to the nonvolatile memory device in a low resistance state, a current flowing in the nonvolatile memory device may be a high current and thus may correspond to the high state signal. Likewise, in order to store a low state signal in a nonvolatile memory device, the resistance of the nonvolatile memory device has to be varied to a high resistance state. If a desired (or alternatively, predetermined) voltage is applied to the nonvolatile memory device in a high resistance state, a current flowing in the nonvolatile memory device may be a low current and thus may correspond to the low state signal.

FIG. 1 is a block diagram of a multi-valued logic device 100a according to an example embodiment.

Referring to FIG. 1, the multi-valued logic device 100a may be a device for storing a multi level signal according to a write signal W and outputting the stored multi level signal according to a read signal /W, and may include a conversion unit 110, a plurality of nonvolatile memory devices, e.g., first and second nonvolatile memory devices NV1 and NV2, a write/read unit 120, a control unit 130, a level restoring unit 140, and a latch 150.

The conversion unit 110 may be configured to convert an input multi level signal into a plurality of partial signals, e.g., first and second partial signals S0 and S1. The first and second partial signals S0 and S1 may correspond to parts of the multi level signal, and thus may include partial information of the multi level signal. Each of the first and second partial signals S0 and S1 may be a binary signal having a desired (or alternatively, predetermined) number of bits, and the number of bits of each of the first and second partial signals S0 and S1 may be less than the number of bits of the multi level signal.

For example, if the multi-valued logic device 100a is designed to process a multi level signal having four levels (e.g., a multi level signal having four current values of 0 uA, 10 uA, 20 uA, and 30 uA), the number of bits of the multi level signal is 2. In this case, the multi level signal may be converted into two 1-bit binary partial signals. As another example, if the multi-valued logic device 100a is designed to process a multi level signal having sixteen levels (e.g., a multi level signal having sixteen current values of 0 uA, 10 uA, . . . , 140 uA, and 150 uA), the number of bits of the multi level signal is 4. In this case, the multi level signal may be converted into four 1-bit binary partial signals or two 2-bit binary partial signals. Accordingly, the number of bits of each of the first and second partial signals S0 and S1 may be less than the number of bits of the multi level signal.

The first and second nonvolatile memory devices NV1 and NV2 may respectively store the first and second partial signals S0 and S1. In this case, each of the first and second nonvolatile memory devices NV1 and NV2 may store a signal having a number of bits less than the number of bits of the multi level signal. That is, if the number of bits of the multi level signal processed by the multi-valued logic device 100a is m and a maximum number of bits of a signal to be stored in each of the first and second nonvolatile memory devices NV1 and NV2 is n, n<m may be satisfied. That is, each of the first and second nonvolatile memory devices NV1 and NV2 may be an n-bit multi level cell (MLC) nonvolatile memory device (here, 1<n<m), or a 1-bit single level cell (SLC) nonvolatile memory device. Although not shown in FIG. 1, a plurality of nonvolatile memory devices may be aligned in the form of an array and a detailed description thereof will be provided below with reference to FIG. It should be noted that the multi-valued logic device 100a is configured to store a partial signal, having a number of bits less than the number of bits of a multi level signal, in a nonvolatile memory device. If a (for example, 3-or-more-bit) multi level signal has to be stored in a nonvolatile memory device, a (for example, 3-or-more-bit) MLC nonvolatile memory device corresponding to the multi level signal may not be easily implemented. Furthermore, even when a multi-valued logic device is implemented by using such a nonvolatile memory device, the reliability of the nonvolatile memory device may be reduced and thus stable operation may not be easily achieved.

However, the multi-valued logic device 100a according to an example embodiment is configured to store a partial signal having a number of bits less than the number of bits of a multi level signal, in a nonvolatile memory device. That is, the multi-valued logic device 100a may store a partial signal having a number of bits (for example, 2-or-less bits) less than a required number of bits (for example, 3-or-more bits) of a multi level signal, in a nonvolatile memory device. Accordingly, the multi-valued logic device 100a may be easily and reliably implemented by using MLC nonvolatile memory devices each having a smaller number of bits than the multi level signal, or even SLC nonvolatile memory devices.

The write/read unit 120 may store the multi level signal in the first and second nonvolatile memory devices NV1 and NV2 in the form of the first and second partial signals S0 and S1, and may read the first and second partial signals S0 and S1 stored in the first and second nonvolatile memory devices NV1 and NV2 so as to output the multi level signal. For this, the write/read unit 120 may include a write unit 123 that operates according to the write signal W, and a read unit 125 that operates according to the read signal /W.

The write unit 123 may be configured to store the first and second partial signals S0 and S1 in the first and second nonvolatile memory devices NV1 and NV2 according to the write signal W. As described above, each of the first and second partial signals S0 and S1 is converted from the multi level signal by the conversion unit 110 and has a number of bits less than the number of bits of the multi level signal. The write unit 123 may include a plurality of voltage applying units (not shown) correspondingly connected to the first and second nonvolatile memory devices NV1 and NV2. The voltage applying units will be described in detail below with reference to FIG. 2.

The read unit 125 may read the first and second partial signals S0 and S1 stored in the first and second nonvolatile memory devices NV1 and NV2 according to the read signal /W, and may output the multi level signal based on the read first and second partial signals S0 and S1. Since the first and second partial signals S0 and S1 correspond to parts of the multi level signal, the read first and second partial signals S0 and S1 correspond to partial information of the multi level signal and thus the multi level signal may be restored based on the read first and second partial signals S0 and S1. The read unit 125 may include a plurality of current generating units (not shown) correspondingly connected to the first and second nonvolatile memory devices NV1 and NV2. The current generating units will be described in detail below with reference to FIG. 2.

The control unit 130 may control the write/read unit 120. In more detail, the control unit 130 may generate and transmit the write signal W to the write unit 123 based on the first and second partial signals S0 and S1 such that information of the multi level signal is stored in the first and second nonvolatile memory devices NV1 and NV2. Also, the control unit 130 may generate and transmit the read signal /W to the read unit 125 such that the multi level signal is output by the write/read unit 120. The write and read signals W and /W generated by the control unit 130 will be described in detail below with reference to FIG. 2.

Optionally, the conversion unit 110 may include a comparison unit 113 and a decoder 115. The comparison unit 113 may be configured to generate a plurality of period signals corresponding to boundaries between level periods of the multi level signal, and the decoder 115 may be configured to generate the first and second partial signals S0 and S1 based on the period signals.

For example, if the multi-valued logic device 100a is designed to process a multi level signal having four levels (e.g., a multi level signal having four current values of 0 uA, 10 uA, 20 uA, and 30 uA), the multi level signal may have four level periods. In more detail, the level periods may include a first period from 0 uA to 5 uA, a second period from 5 uA to 15 uA, a third period from 15 uA to 25 uA, and a fourth period exceeding 25 uA.

In this case, the comparison unit 113 may be configured to generate three period signals corresponding to boundaries between the four level periods (the first through fourth periods). In other words, the three period signals may represent the boundaries between the four level periods (the boundary between the first and second periods, the boundary between the second and third periods, and the boundary between the third and fourth periods).

The period signals may be represented as gray codes, and the comparison unit 113 may generate p−1 period signals corresponding to boundaries between p level periods of the multi level signal. If the number of bits of the multi level signal is n, the multi level signal may have $2n$ level periods. According to an example embodiment, the comparison unit 113 may generate 2n−1 period signals corresponding to boundaries between 2n level periods of the multi level signal.

The decoder 115 may generate the first and second partial signals S0 and S1 based on the period signals, and the generated first and second partial signals S0 and S1 may be stored in the first and second nonvolatile memory devices NV1 and NV2. The first and second partial signals S0 and S1 may be, for example, binary signals and, in this case, the decoder 115 may be a binary decoder configured to generate the binary signals based on the period signals. Furthermore, if the period signals are represented as gray codes, the binary decoder may generate the binary signals based on the gray codes. An example of a binary decoder for receiving a gray code as a period signal and outputting the binary signal as a partial signal will be described in detail below with reference to FIG. 4.

The level restoring unit 140 may be configured to restore and output the multi level signal by using the period signals. The multi level signal output from the level restoring unit 140 may be utilized for internal use. That is, the multi level signal restored by the level restoring unit 140 may be transmitted to another logic block (not shown) in the multi-valued logic device 100a. The level restoring unit 140 may include a current mirror circuit (not shown) in order to restore the multi level signal by using the period signals. The current mirror circuit will be described in detail below with reference to FIG. 4.

The latch 150 may store the period signals and may transmit the period signals to the level restoring unit 140 in response to a clock signal. In more detail, the period signals generated by the comparison unit 113 may be stored in the latch 150 and the latch 150 may transmit the period signals to the level restoring unit 140 in response to the clock signal. Accordingly, the level restoring unit 140 may be activated according to the clock signal so as to output the multi level signal.

Figure 2:
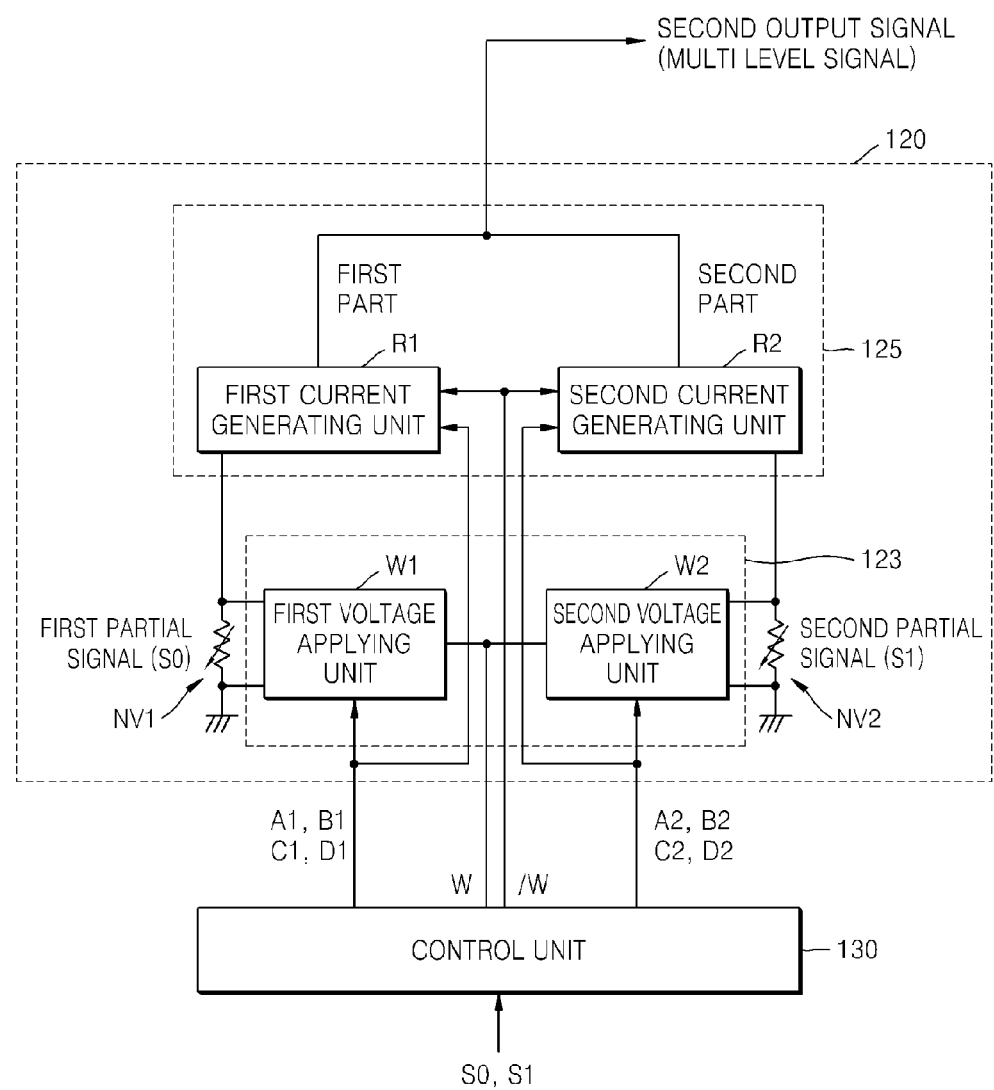
FIG. 2 is a detailed block diagram of a control unit and a write/read unit of the multi-valued logic device illustrated in FIG. 1.

FIG. 2 is a detailed block diagram of the control unit 130 and the write/read unit 120 of the multi-valued logic device 100a illustrated in FIG. 1.

Referring to FIGS. 1 and 2, the write unit 123 may include first and second voltage applying units W1 and W2 respectively connected to the first and second nonvolatile memory devices NV1 and NV2. The first and second voltage applying units W1 and W2 may apply voltages (for example, set or reset voltages) to the first and second nonvolatile memory devices NV1 and NV2 such that the first and second nonvolatile memory devices NV1 and NV2 store the first and second partial signals S0 and S1. The voltages may vary resistances of the first and second nonvolatile memory devices NV1 and NV2.

The read unit 125 may include first and second current generating units R1 and R2 respectively connected to the first and second nonvolatile memory devices NV1 and NV2. The first and second current generating units R1 and R2 may be configured to output parts of a multi level signal, respectively, based on the first and second partial signals S0 and S1 stored in the first and second nonvolatile memory devices NV1 and NV2. Since the partial signals S0 and S1 form the multi level signal, if the partial signals S0 and S1 are output and combined, the multi level signal may be output. Accordingly, the first and second current generating units R1 and R2 may be respectively connected between an output terminal of the read unit 125 and the first and second nonvolatile memory devices NV1 and NV2. Each of the first and second current generating units R1 and R2 may include a current mirror circuit (not shown) in order to restore the parts of the multi level signal by using the first and second partial signals S0 and S1. The current mirror circuit will be described in detail below with reference to FIG. 8.

For example, if the multi-valued logic device 100a is designed to process a multi level signal having four levels (e.g., a multi level signal having four current values of 0 uA, 10 uA, 20 uA, and 30 uA), the conversion unit 110 may generate two 1-bit partial signals (e.g., the first and second partial signals S0 and S1) from the 2-bit multi level signal and may transmit the two 1-bit partial signals to the control unit 130, as shown in Table 1.

TABLE 1

| Multi Level Signal (2 bits) | Second Partial Signal S1 (1 bit) | First Partial Signal S0 (1 bit) |
|---|---|---|
| 0 (uA) | 0 (low state) | 0 (low state) |
| 10 (uA) | 0 (low state) | 1 (high state) |
| 20 (uA) | 1 (high state) | 0 (low state) |
| 30 (uA) | 1 (high state) | 1 (high state) |

The control unit 130 may generate the write signal W for controlling the first and second voltage applying units W1 and W2 based on the first and second partial signals S0 and S1, and may transmit the write signal W to the write unit 123.

The first voltage applying unit W1 of the write unit 123 may apply a first voltage to the first nonvolatile memory device NV1 such that the first nonvolatile memory device NV1 stores the first partial signal S0. Also, the second voltage applying unit W2 of the write unit 123 may apply a second voltage to the second nonvolatile memory device NV2 such that the second nonvolatile memory device NV2 stores the second partial signal S1. The first and second voltage applying units W1 and W2 may respectively include first state (reset) and second state (set) voltage applying units (not shown). The first state and second state voltage applying units will be described in detail below with reference to FIGS. 6 and 7.

The control unit 130 may generate and transmit the read signal /W to the read unit 125 in order to output the multi level signal based on the first and second partial signals S0 and S1.

The first current generating unit R1 of read unit 125 may be configured to output a first part of the multi level signal based on the first partial signal S0 stored in the first nonvolatile memory device NV1. Also, the second current generating unit R2 of read unit 125 may be configured to output a second part of the multi level signal based on the second partial signal S1 stored in the second nonvolatile memory device NV2. The first current generating unit R1 may include a first current mirror circuit (not shown) in order to output the first part of the multi level signal, and the second current generating unit R2 may include a second current mirror circuit (not shown) in order to output the second part of the multi level signal.

Figure 3:
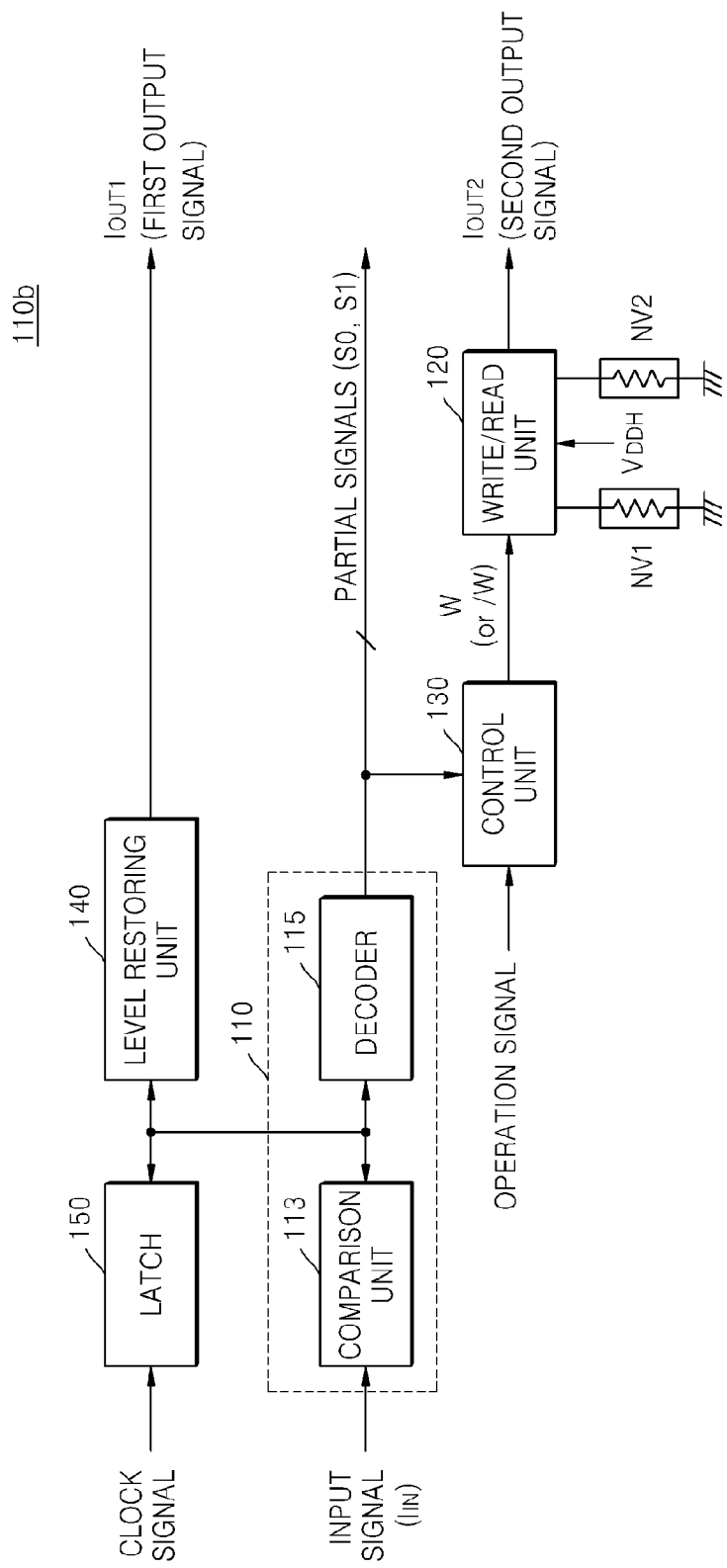
FIG. 3 is a block diagram of a multi-valued logic device according to another example embodiment.

FIG. 3 is a block diagram of a multi-valued logic device 100b according to another example embodiment. The multi-valued logic device 100b may be modified from the multi-valued logic device 100a illustrated in FIGS. 1 and 2. Repeated descriptions will not be provided here.

Referring to FIG. 3, as described above in relation to FIGS. 1 and 2, the multi-valued logic device 100b may include the conversion unit 110, the first and second nonvolatile memory devices NV1 and NV2, the write/read unit 120, the control unit 130, the level restoring unit 140, and the latch 150. These elements are described in detail above in relation to FIGS. 1 and 2, and thus will not be described here.

The multi-valued logic device 100b may store an input signal $I_{IN}$, i.e., a multi level signal, according to an operation signal, and may output the stored input signal $I_{IN}$ as first and second output signals IOUT1 and IOUT2. In more detail, the control unit 130 may generate the write signal W based on the operation signal and the first and second partial signals S0 and S1 received from the decoder 115 in order to store the multi level signal. Due to the write signal W, an m-bit multi level signal may be stored in the first and second nonvolatile memory devices NV1 and NV2 in the form of n-bit partial signals (here n<m).

The control unit 130 may generate the read signal /W based on an operation signal in order to output the multi level signal. Due to the read signal /W, the first and second partial signals S0 and S1 stored in the first and second nonvolatile memory devices NV1 and NV2 may be read. Parts of the multi level signal may be output based on the read first and second partial signals S0 and S1. Consequently, the multi level signal may be output.

The first and second partial signals S0 and S1 output from the decoder 115 may be utilized for internal use. That is, the first and second partial signals S0 and S1 output from the decoder 115 may be transmitted to another logic block (not shown) in the multi-valued logic device 100b.

Figure 4:
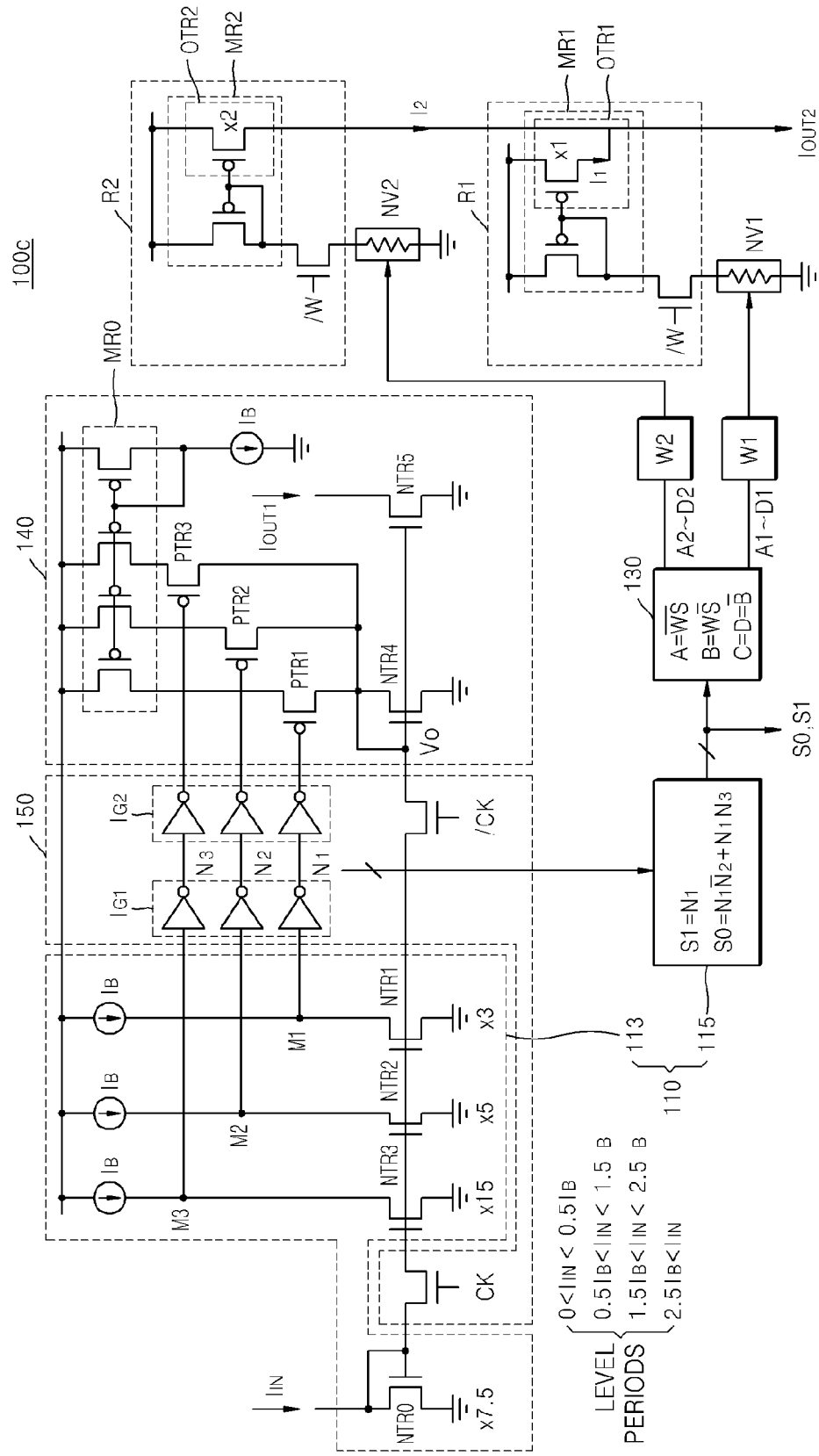
FIG. 4 is a block diagram of a multi-valued logic device according to another example embodiment.

FIG. 4 is a block diagram of a multi-valued logic device 100c according to another example embodiment. The multi-valued logic device 100c may be modified from the multi-valued logic devices 100a and 100b illustrated in FIGS. 1 through 3. Repeated descriptions will not be provided here.

Referring to FIG. 4, the multi-valued logic device 100c may include the conversion unit 110, the first and second nonvolatile memory devices NV1 and NV2, the write/read unit 120, the control unit 130, the level restoring unit 140, and the latch 150. Individual operations of these elements are described above in relation to FIGS. 1 through 3.

Hereinafter, i) a process of receiving and storing a multi level signal in nonvolatile memory devices, ii) a process of outputting the multi level signal from a level restoring unit, and iii) a process of outputting the multi level signal by using partial signals stored in the nonvolatile memory devices will now be described with reference to FIG. 4.

If the multi-valued logic device 100c is designed to process a multi level signal having four levels (e.g., a multi level signal having four current values of 0 uA, 10 uA, 20 uA, and 30 uA), the comparison unit 113 of the conversion unit 110 may generate first through third period signals M1 through M3 by using the four-level (i.e., 2-bit) multi level signal, as shown in Table 2. Optionally, the comparison unit 113 may generate the first through third period signals M1 through M3 in response to a clock signal CK of the latch 150.

TABLE 2

| Multi Level Signal | First Period Signal M1 | Second Period Signal M2 | Third Period Signal M3 |
|---|---|---|---|
| 0 (uA) | 1 | 1 | 1 |
| 10 (uA) | 0 | 1 | 1 |
| 20 (uA) | 0 | 0 | 1 |
| 30 (uA) | 0 | 0 | 0 |

A gate voltage of a transistor NTR0 may be proportional to a current value of the multi level signal. Accordingly, if the multi level signal has a current value from 0 uA to 5 uA (here, $I_B$=10 uA), transistors NTR1, NTR2, and NTR3 are turned off and thus the comparison unit 113 outputs the first through third period signals M1 through M3 in a high state.

If the multi level signal has a current value from 5 uA to 15 uA (here, IB=10 uA), only the transistor NTR1 having the lowest capacity (×3) is turned on and the other transistors NTR2 and NTR3 having higher capacities (×5, ×15) are turned off. Accordingly, the comparison unit 113 outputs the first period signal M1 in a low state and outputs the second and third period signals M2 and M3 in a high state.

If the multi level signal has a current value from 15 uA to 25 uA (here, IB=10 uA), the transistors NTR1 and NTR2 having low capacities (×3, ×5) are turned on and the transistor NTR3 having the highest capacity (×15) is turned off. Accordingly, the comparison unit 113 outputs the first and second period signals M1 and M2 in a low state and outputs the third period signal M3 in a high state.

If the multi level signal has a current value exceeding 25 uA (here, IB=10 uA), the transistors NTR1, NTR2, and NTR3 are turned on. Accordingly, the comparison unit 113 outputs the first through third period signals M1 through M3 in a low state.

The first through third period signals M1 through M3 generated by the comparison unit 113 may be inverted by a first inverter group IG1 of the latch 150, and then may be transmitted to the decoder 115 as signals N1, N2, and N3. In this way, the decoder 115 may generate the first and second partial signals S0 and S1 based on the first through third period signals M1 through M3. For example, the first through third period signals M1 through M3 shown in Table 2 may be generated into the first and second partial signals S0 and S1 by performing logical operations as represented in Equations 1 and 2.

$$S_0 = N_1 \overline{N_2} + N_1 N_3 \qquad \text{[Equation 1]}$$

$$S_1 = N_2 \qquad \text{[Equation 2]}$$

As a result of performing the logical operations as represented in Equations 1 and 2, the first and second partial signals S0 and S1 may be obtained as shown in Table 3.

TABLE 3

| First Period Signal M1 | Second Period Signal M2 | Third Period Signal M3 | Second Partial Signal S1 | First Partial Signal S0 |
|---|---|---|---|---|
| 1 | 1 | 1 | 0 | 0 |
| 0 | 1 | 1 | 0 | 1 |
| 0 | 0 | 1 | 1 | 0 |
| 0 | 0 | 0 | 1 | 1 |

It should be noted that the first and second partial signals S0 and S1 shown in Table 3 are the same as the first and second partial signals S0 and S1 shown in Table 1.

After that, the control unit 130 may receive and store the first and second partial signals S0 and S1 respectively in the first and second nonvolatile memory devices NV1 and NV2. The control unit 130 may receive the write signal W and may generate control signals A, B, C, and D for controlling the first and second voltage applying units W1 and W2, by using the first or second partial signal S0 or S1 by performing logical operations as represented in Equations 3, 4, and 5. In Equations 3, 4, and 5, S represents one of partial signals S0 and S1.

$$A = \overline{WS} \qquad \text{[Equation 3]}$$

$$B = \overline{W}S \qquad \text{[Equation 4]}$$

$$C = D = \overline{B} \qquad \text{[Equation 5]}$$

As a result of performing the logical operations as represented in Equations 3, 4, and 5, the control signals A, B, C, and D may be obtained as shown in Table 4. The control signals A, B, C, and D may be transmitted to the first and second voltage applying units W1 and W2, and the first and second voltage applying units W1 and W2 may vary resistances of the first and second nonvolatile memory devices NV1 and NV2 based on the write signal W and the control signals A, B, C, and D. As a result of varying the resistances of the first and second nonvolatile memory devices NV1 and NV2, currents flowing in the first and second nonvolatile memory devices NV1 and NV2 are changed. The currents may correspond to the first and second partial signals S0 and S1. Ultimately, the first and second partial signals S0 and S1 are respectively stored in the first and second nonvolatile memory devices NV1 and NV2.

TABLE 4

| Partial Signal | A | B | C | D | Current Flowing in Nonvolatile Memory Device |
|---|---|---|---|---|---|
| 0 | 1 | 1 | 0 | 0 | 0 (Nonvolatile Memory Device having High Resistance) |
| 1 | 0 | 0 | 1 | 1 | 1 (Nonvolatile Memory Device having Low Resistance) |

For example, if the decoder 115 obtains the first and second partial signals S0 and S1 as shown in Table 3, the control unit 130 may generate the write signal W and first control signals A1, B1, C1, and D1 for controlling the first voltage applying unit W1, and the write signal W and second control signals A2, B2, C2, and D2 for controlling the second voltage applying unit W2. The first and second voltage applying units W1 and W2 may vary the resistances of the first and second nonvolatile memory devices NV1 and NV2 as shown in Table 5.

TABLE 5

| Second Partial Signal S1 | First Partial Signal S0 | Second Nonvolatile Memory Device NV2 | First Nonvolatile Memory Device NV1 |
|---|---|---|---|
| 0 | 0 | High Resistance (Flowing Current 0) | High Resistance (Flowing Current 0) |
| 0 | 1 | High Resistance (Flowing Current 0) | Low Resistance (Flowing Current 1) |
| 1 | 0 | Low Resistance (Flowing Current 1) | High Resistance (Flowing Current 0) |
| 1 | 1 | Low Resistance (Flowing Current 1) | Low Resistance (Flowing Current 1) |

It is noted that the current flowing in the first nonvolatile memory device NV1 is equal to the first partial signal S0 as a result of varying the resistance of the first nonvolatile memory device NV1, and the current flowing in the second nonvolatile memory device NV2 is equal to the second partial signal S1 as a result of varying the resistance of the second nonvolatile memory device NV2. As discussed above, at least one example embodiment includes a process of converting a 2-bit multi level signal into the 1-bit first and second partial signals S0 and S1 and storing the first and second partial signals S0 and S1 in the first and second nonvolatile memory devices NV1 and NV2.

Although the above description is provided with the assumption that a 2-bit multi level signal is converted into 1-bit partial signals and the partial signals are stored in nonvolatile memory devices, the numbers of bits of the multi level signal and the partial signals are not limited thereto. A 3-or-more-bit multi level signal may be processed, and the partial signals are not limited to 1-bit signals. That is, example embodiments are not limited thereto as long as the number of bits of each of the partial signals stored in the nonvolatile memory devices is less than the number of bits of the multi level signal.

The first through third period signals M1 through M3 generated by the comparison unit 113 may be inverted by the first inverter group IG1 of the latch 150, may be re-inverted by a second inverter group IG2 of the latch 150, and then may be transmitted to the level restoring unit 140. The first through third period signals M1 through M3 transmitted to the level restoring unit 140 are inverted twice and thus may have levels similar to the levels of the first through third period signals M1 through M3. Accordingly, a current mirror circuit MR0 may output the first output signal $I_{OUT1}$ (i.e., a multi level signal) based on currents flowing in transistors PTR1, PTR2, and PTR3 due to the first through third period signals M1 through M3 (or signals having levels similar to the levels of the first through third period signals M1 through M3).

For example, if the first through third period signals M1 through M3 respectively have values of 1, 1, and 1, the transistors PTR1, PTR2, and PTR3 are turned off. Thus, the currents flowing in the transistors PTR1, PTR2, and PTR3 are 0 uA. Since a gate voltage V0 of a transistor NTR4 is proportional to current amounts of the transistors PTR1, PTR2, and PTR3 and a sum of the current amounts is 0 uA, gate voltages Vo of transistors NTR4 and NTR5 are very low voltages. Accordingly, a current flowing in the transistor NTR5 is 0 uA and thus the first output signal $I_{OUT1}$ having a current value of 0 uA may be output.

If the first through third period signals M1 through M3 respectively have values of 0, 1, and 1, the transistors PTR2 and PTR3 are turned off and the transistor PTR1 is turned on. Thus, the currents flowing in the transistors PTR2 and PTR3 are 0 uA and the current flowing in the transistor PTR1 is 10 uA (here, IB=10 uA). Since the gate voltage V0 of the transistor NTR4 is proportional to current amounts of the transistors PTR1, PTR2, and PTR3 and a sum of the current amounts is 10 uA, the gate voltages Vo of the transistors NTR4 and NTR5 are low voltages. Accordingly, the current flowing in the transistor NTR5 is 10 uA and thus the first output signal $I_{OUT1}$ having a current value of 10 uA may be output.

If the first through third period signals M1 through M3 respectively have values of 0, 0, and 1, the transistor PTR3 is turned off and the transistors PTR1 and PTR2 are turned on. Thus, the current flowing in the transistor PTR3 is 0 uA and the currents flowing in the transistors PTR1 and PTR2 are 10 uA (here, IB=10 uA). Since the gate voltage V0 of the transistor NTR4 is proportional to current amounts of the transistors PTR1, PTR2, and PTR3 and a sum of the current amounts is 20 uA, the gate voltages Vo of the transistors NTR4 and NTR5 are high voltages. Accordingly, the current flowing in the transistor NTR5 is 20 uA and thus the first output signal $I_{OUT1}$ having a current value of 20 uA may be output.

If the first through third period signals M1 through M3 respectively have values of 0, 0, and 0, the transistors PTR1, PTR2, and PTR3 are turned on. Thus, the currents flowing in the transistors PTR1, PTR2, and PTR3 are 10 uA (here, $I_B$=10 uA). Since the gate voltage V0 of the transistor NTR4 is proportional to current amounts of the transistors PTR1, PTR2, and PTR3 and a sum of the current amounts is 30 uA, the gate voltages Vo of transistors NTR4 and NTR5 are very high voltages. Accordingly, the current flowing in the transistor NTR5 is 30 uA and thus the first output signal $I_{OUT1}$ having a current value of 30 uA may be output.

As such, the level restoring unit 140 may output the first output signal $I_{OUT1}$ having current values of 0 uA, 10 uA, 20 uA, and 30 uA in correspondence with the input signal $I_{IN}$ (i.e., a multi level signal) having current values of 0 uA, 10 uA, 20 uA, and 30. Optionally, the comparison unit 113 may be activated according to the clock signal CK of the latch 150 so as to vary the input signal $I_{IN}$ into the first through third period signals M1 through M3, and the level restoring unit 140 may be activated according to a clock bar signal /CK of the latch 150 so as to output the first output signal $I_{OUT1}$. As described above, at least one example embodiment includes a process of converting a 2-bit multi level signal into the first through third period signals M1 through M3, i.e., gray codes, and outputting the first through third period signals M1 through M3 from the level restoring unit 140.

Although the above description is provided with the assumption that a 2-bit multi level signal is converted into period signals, i.e., gray codes, and is output from a current mirror circuit of a level restoring unit, example embodiments are not limited to the above configuration and may be implemented as another configuration.

The control unit 130 may generate the control signals A, B, C, and D for controlling the first and second current generating units R1 and R2 in response to the read signal /W. Since /W=1 and W=0, as a result of operating the control unit 130 as represented in Equations 3, 4, and 5, the control signals A, B, C, and D may be obtained as shown in Table 6.

TABLE 6

| Partial Signal | Read Signal/W | A | B | C | D |
|---|---|---|---|---|---|
| 0 | 0 | 1 | 0 | 1 | 1 |
| 1 | 0 | 1 | 0 | 1 | 1 |

The first and second current generating units R1 and R2 may receive the read signal /W and the control signals A, B, C, and D from the control unit 130 and may read the first and second partial signals S0 and S1 stored in the first and second nonvolatile memory devices NV1 and NV2. Accordingly, the multi level signal may be output.

The first current generating unit R1 may be connected between the output terminal of the read unit 125 and the first nonvolatile memory device NV1. In at least one example embodiment, the first current generating unit R1 may read the first partial signal S0 stored in the first nonvolatile memory device NV1 and thus a first part $I_1$ of the multi level signal may be output. In more detail, a current flowing in the first nonvolatile memory device NV1 may be transmitted to a first current mirror circuit MR1 according to a resistance value of the first nonvolatile memory device NV1, and the transmitted current may be output as the first part $I_1$ of the multi level signal.

Likewise, the second current generating unit R2 may be connected between the output terminal of the read unit 125 and the second nonvolatile memory device NV2. In at least one example embodiment, the second current generating unit R2 may read the second partial signal S1 stored in the second nonvolatile memory device NV2 and thus a second part $I_2$ of the multi level signal may be output. In more detail, a current flowing in the second nonvolatile memory device NV2 may be transmitted to a second current mirror circuit MR2 according to a resistance value of the second nonvolatile memory device NV2, and the transmitted current may be output as the second part $I_2$ of the multi level signal.

The first and second parts $I_1$ and $I_2$ output from the first and second current generating units R1 and R2 may be combined and output as the second output signal $I_{OUT2}$, i.e., a multi level signal.

For example, if the second partial signal S1 has a value of '0' and the first partial signal S0 has a value of '0', the first and second nonvolatile memory devices NV1 and NV2 have high resistances. Thus, the currents flowing in the first and second nonvolatile memory devices NV1 and NV2 may have low values. The currents having low values are transmitted to the first and second current mirror circuits MR1 and MR2. Accordingly, the second output signal $I_{OUT2}$ having a current value of 0 uA may be output by first and second output transistors OTR1 and OTR2.

If the second partial signal S1 has a value of '0' and the first partial signal S0 has a value of '1', the first nonvolatile memory device NV1 has a low resistance and the second nonvolatile memory device NV2 has a high resistance. Thus, the current flowing in the first nonvolatile memory device NV1 may have a high value and the current flowing in the second nonvolatile memory device NV2 may have a low value. The current having a high value is transmitted to the first current mirror circuit MR1 and the current having a low value is transmitted to the second current mirror circuit MR2. Accordingly, the first output transistor OTR1 may output the first part $I_1$ having a current value of 10 uA, and the second output transistor OTR2 may output the second part $I_2$ having a current value of 0 uA. Ultimately, the second output signal $I_{OUT2}$ having a current value of 10 uA may be output from the output terminal of the read unit 125.

If the second partial signal S1 has a value of '1' and the first partial signal S0 has a value of '0', the first nonvolatile memory device NV1 has a high resistance and the second nonvolatile memory device NV2 has a low resistance. Thus, the current flowing in the first nonvolatile memory device NV1 may have a low value and the current flowing in the second nonvolatile memory device NV2 may have a high value. The current having a low value is transmitted to the first current mirror circuit MR1 and the current having a high value is transmitted to the second current mirror circuit MR2. Accordingly, the first output transistor OTR1 may output the first part $I_1$ having a current value of 0 uA, and the second output transistor OTR2 (it is noted that the second output transistor OTR2 has a capacity two times greater than the capacity of the first output transistor OTR1) may output the second part $I_2$ having a current value of 20 uA. Ultimately, the second output signal $I_{OUT2}$ having a current value of 20 uA may be output from the output terminal of the read unit 125.

If the second partial signal S1 has a value of '1' and the first partial signal S0 has a value of '1', the first and second nonvolatile memory devices NV1 and NV2 have low resistances. Thus, the currents flowing in the first and second nonvolatile memory devices NV1 and NV2 may have high values. The currents having high values are transmitted to the first and second current mirror circuits MR1 and MR2. Accordingly, the first output transistor OTR1 may output the first part $I_1$ having a current value of 10 uA, and the second output transistor OTR2 (it is noted that the second output transistor OTR2 has a capacity two times greater than the capacity of the first output transistor OTR1) may output the second part $I_2$ having a current value of 20 uA. Ultimately, the second output signal $I_{OUT2}$ having a current value of 30 uA may be output from the output terminal of the read unit 125.

As discussed above, a process of reading the first and second partial signals S0 and S1 respectively stored in the first and second nonvolatile memory devices NV1 and NV2 by the read unit 125, and outputting the second output signal $I_{OUT2}$, i.e., a multi level signal, is described. Although the above description is provided with the assumption that a 2-bit multi level signal is output based on 1-bit partial signals, the numbers of bits of the multi level signal and the partial signals are not limited thereto.

Figure 5:
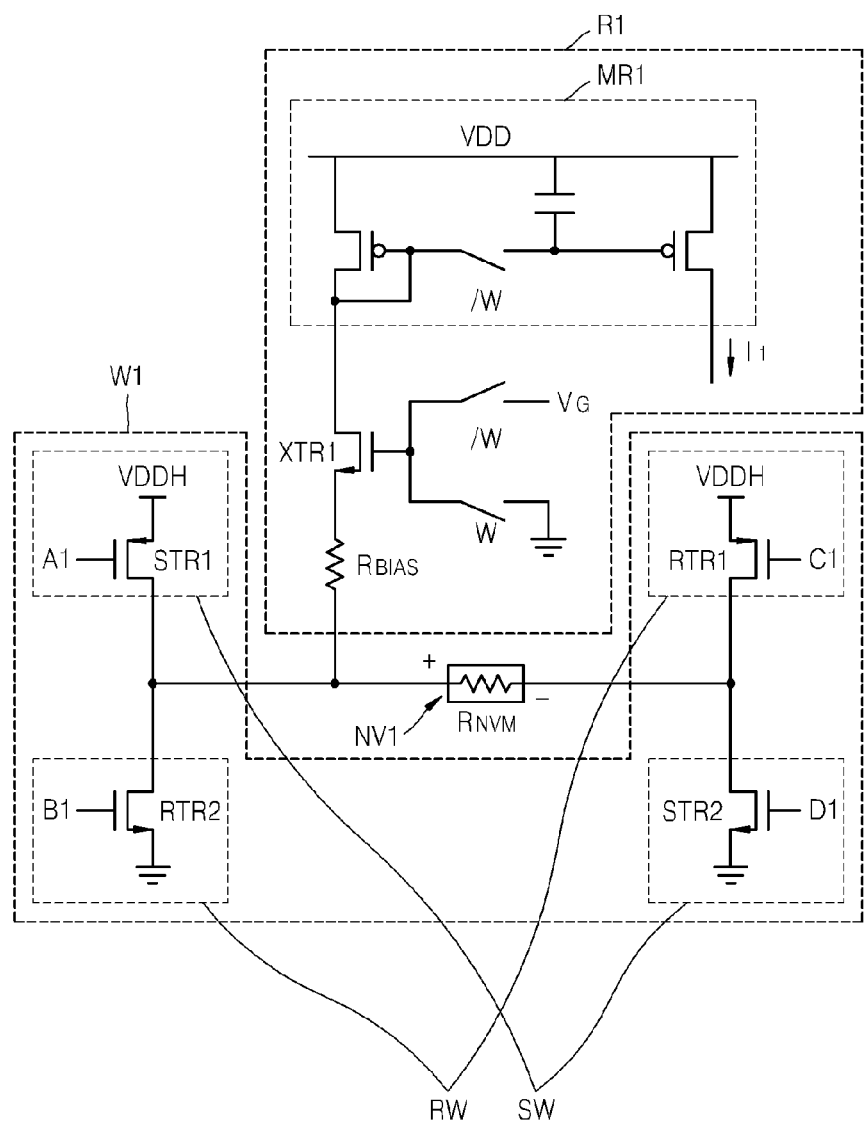
FIG. 5 is a detailed circuit diagram of a portion of a write/read unit of the multi-valued logic device illustrated in FIG. 4.

FIG. 5 is a detailed circuit diagram of a portion of the write/read unit 120 of the multi-valued logic device 100c illustrated in FIG. 4. In more detail, FIG. 5 is a detailed circuit diagram of the first nonvolatile memory device NV1, the first voltage applying unit W1, and the first current generating unit R1.

Referring to FIG. 5, the first voltage applying unit W1 may include a first state voltage applying unit RW also referred to as a reset state voltage applying unit, and a second state voltage applying unit SW also referred to as a set state voltage applying unit.

The first state voltage applying unit RW may be configured to vary the resistance of the first nonvolatile memory device NV1 to a first state (e.g., a reset state or a high resistance state). The second state voltage applying unit SW may be configured to vary the resistance of the first nonvolatile memory device NV1 to a second state (e.g., a set state or a low resistance state).

When a 2-bit multi level signal is converted into the 1-bit first and second partial signals S0 and S1 and the first and second partial signals S0 and S1 are stored in the first and second nonvolatile memory devices NV1 and NV2, the first voltage applying unit W1 may operate to store the first partial signal S0 in the first nonvolatile memory device NV1. In more detail, if the first partial signal S0 to be stored in the first nonvolatile memory device NV1 is in a low state, the first state voltage applying unit RW may be activated and thus the resistance of the first nonvolatile memory device NV1 may vary into a reset resistance (i.e., a high resistance). If the first partial signal S0 is in a high state, the second state voltage applying unit SW may be activated and thus the resistance of the first nonvolatile memory device NV1 may vary into a set resistance.

Although not shown in FIG. 5, it will be understood that, like the first voltage applying unit W1, the second voltage applying unit W2 connected to the second nonvolatile memory device NV2 illustrated in FIG. 4 may also include a first state voltage applying unit also referred to as a reset state voltage applying unit, and a second state voltage applying unit also referred to as a set state voltage applying unit.

Figure 6:
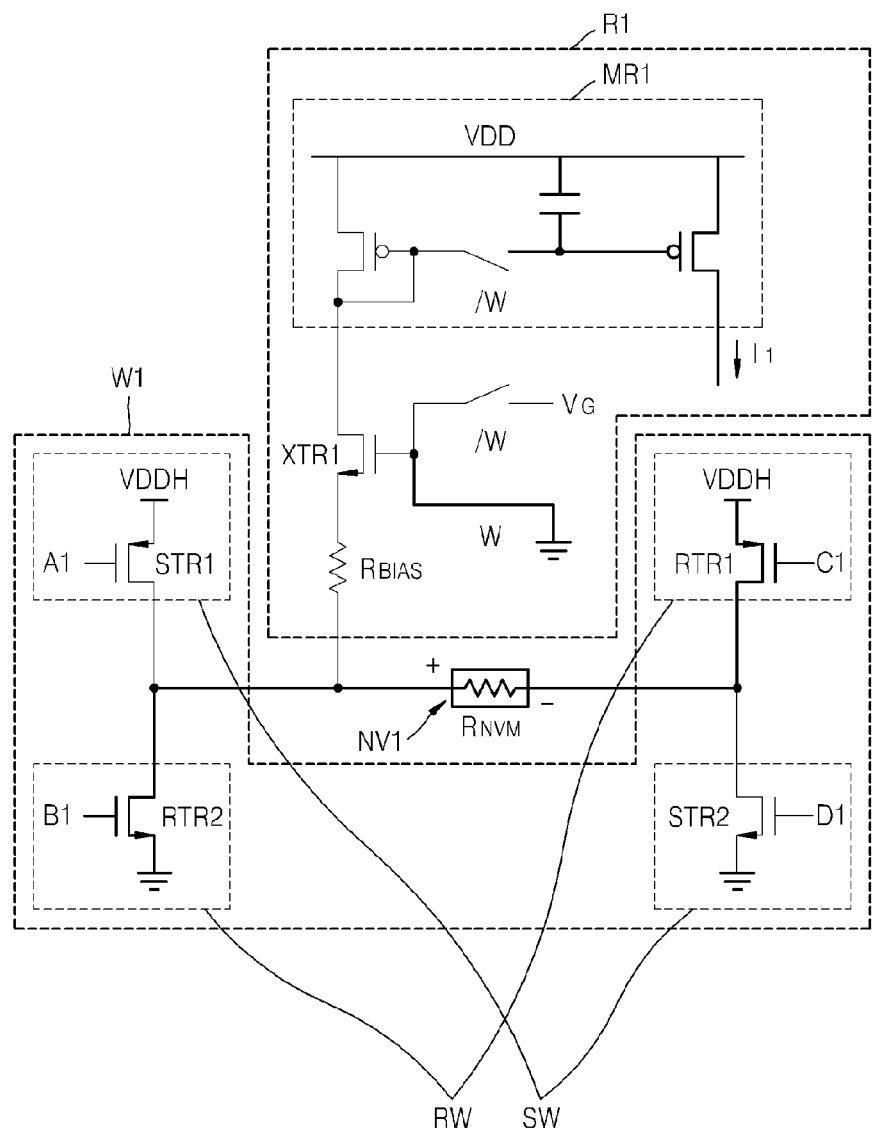
FIGS. 6 and 7 are circuit diagrams showing activation of a first voltage applying unit illustrated in FIG. 5.
Figure 7:
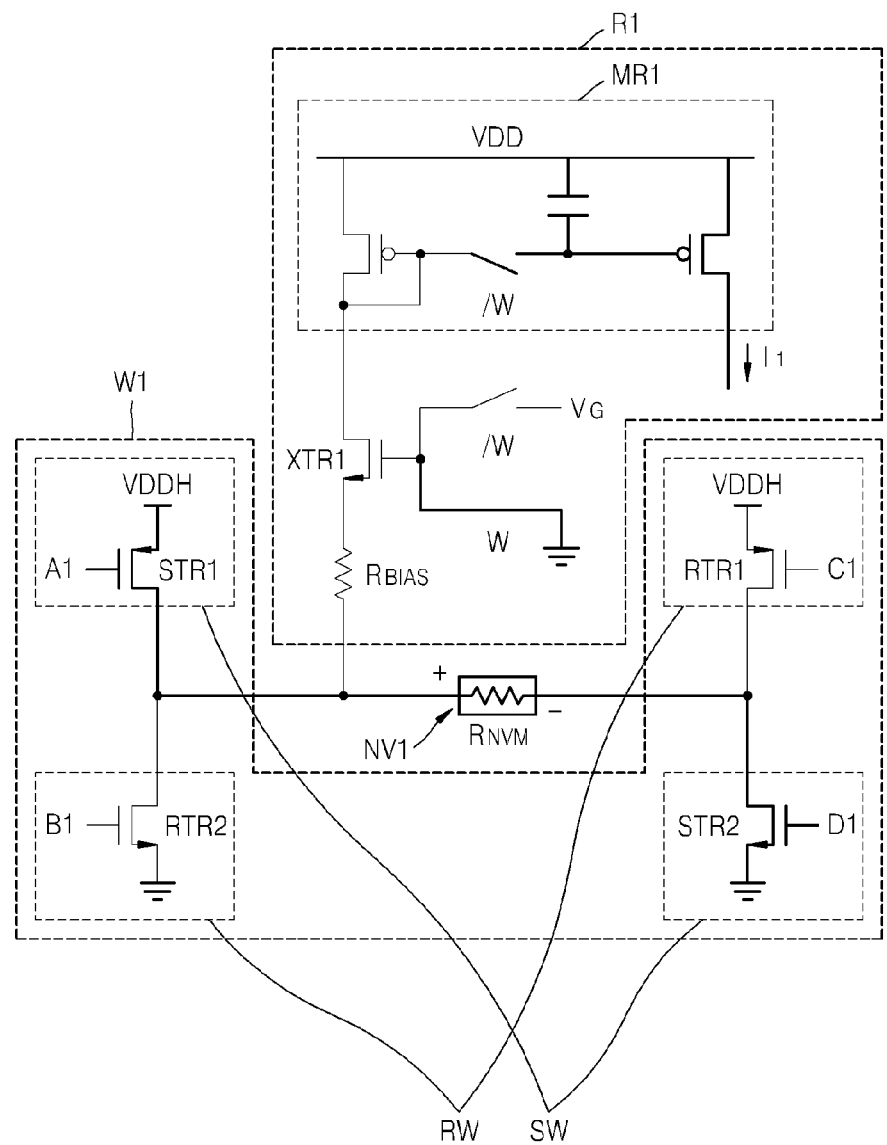
Figure 8:
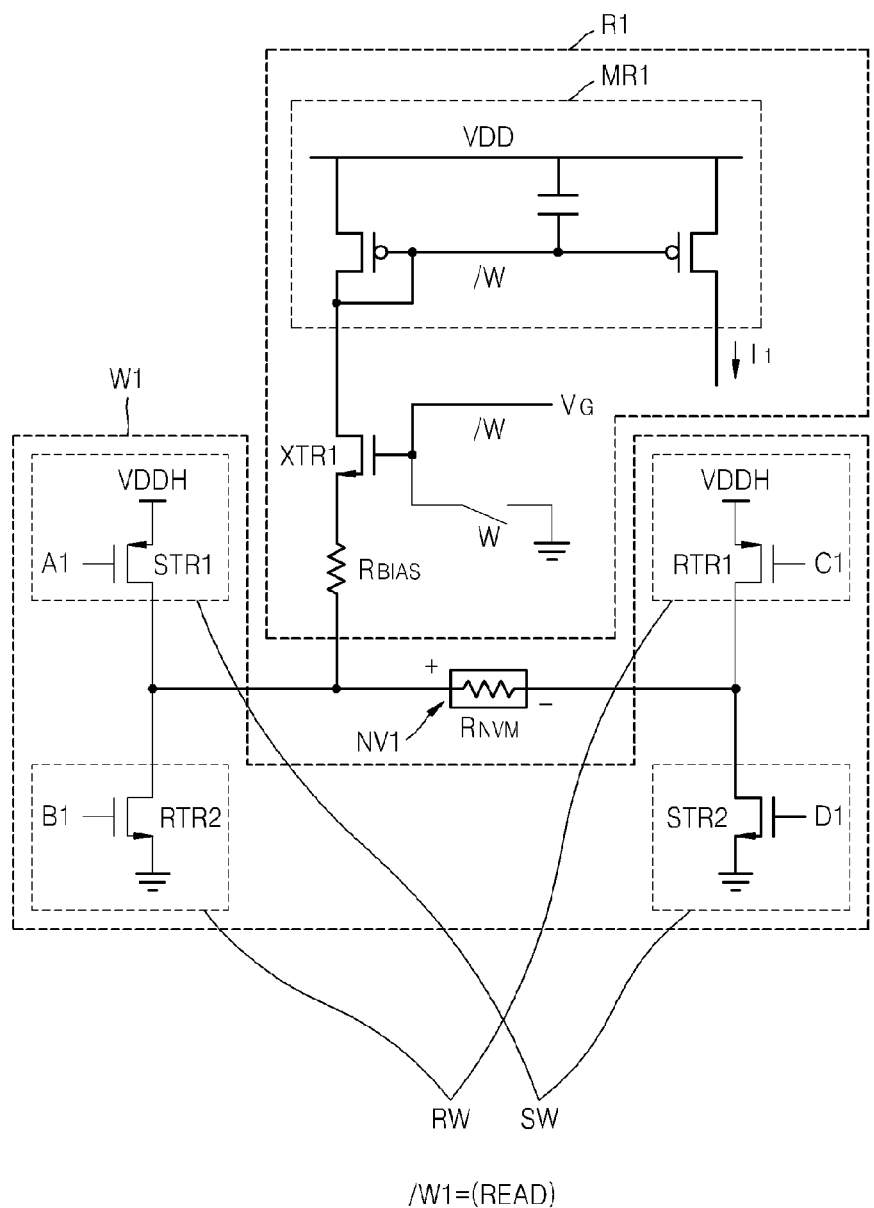
FIG. 8 is a circuit diagram showing activation of a first current generating unit illustrated in FIG. 5.

FIGS. 6 and 7 are circuit diagrams showing activation of the first voltage applying unit W1 illustrated in FIG. 5. FIG. 8 is a circuit diagram showing activation of the first current generating unit R1 illustrated in FIG. 5.

Referring to FIG. 6, if the first partial signal S0 has a value of '0', the control unit 130 may generate the write signal W that satisfies W=1, and may generate the first control signals A1, B1, C1, and D1 that satisfy A1=1, B1=1, C1=0, and D1=0 by performing logical operations as represented in Equations 3 through 5 (see Table 4). The second state voltage applying unit SW including transistors STR1 and STR2 is turned off because A1=1 and D1=0, and the first state voltage applying unit RW including transistors RTR1 and RTR2 is turned on because B1=1 and C1=0. Accordingly, as indicated by the bold line between RTR1 and RTR2, a voltage VDDH may be applied in a first direction and thus the first nonvolatile memory device NV1 may be programmed to a reset state (i.e., a high resistance state).

Referring to FIG. 7, if the first partial signal S0 has a value of '1', the control unit 130 may generate the write signal W that satisfies W=1, and may generate the first control signals A1, B1, C1, and D1 that satisfy A1=0, B1=0, C1=1, and D1=1 by performing logical operations as represented in Equations 3 through 5 (see Table 4). The first state voltage applying unit RW including the transistors RTR1 and RTR2 is turned off because C1=1 and B1=0, and the second state voltage applying unit SW including the transistors STR1 and STR2 is turned on because A1=0 and D1=1. Accordingly, as indicated by the bold line between STR1 and STR2, the voltage VDDH may be applied in a direction opposite to the first direction and thus the first nonvolatile memory device NV1 may be programmed to a set state (i.e., a low resistance state).

Referring to FIG. 8, in order to perform a read operation, the control unit 130 may generate the read signal /W that satisfies /W=1, and may generate the first control signals A1, B1, C1, and D1 that satisfy A1=1, B1=0, C1=1, and D1=1 (see Table 6). The transistors STR1, RTR1, and RTR2 are turned off because A1=1, B1=0, and C1=1, and the transistor STR2 is turned on because D1=1. Also, due to the read signal /W, a driving transistor XTR1 is turned on and thus the first current mirror circuit MR1 operates.

Since the transistor STR2 is turned on, a current flows between the first nonvolatile memory device NV1 and a bias resistor RBIAS connected between a line of a voltage VDD and the ground connected to the transistor STR2. The current is amplified (or alternatively, damped) by the first current mirror circuit MR1 and is output as the first part I1 of the multi level signal. The first part $I_1$ may be defined as represented in Equation 6.

$$I_1 = M \frac{V_G - V_{GS}}{R_{BIAS} + R_{NVM}} \quad \text{[Equation 6]}$$

Here, M is a current mirror ratio of the current mirror circuit MR0 and $V_{GS}$ is a threshold voltage of a transistor. When the first part $I_1$ is calculated, since all values other than the resistance value of the first nonvolatile memory device NV1 are constants, the first part I1 may vary according to the resistance value of the first nonvolatile memory device NV1.

For example, if the first nonvolatile memory device NV1 has a high resistance, the first part I1 has a low value (i.e., '0'). On the other hand, if the first nonvolatile memory device NV1 has a low resistance, the first part I1 has a high value (i.e., '1').

Although not shown in FIGS. 5 and 8, it will be understood that, like the first current generating unit R1, the second current generating unit R2 connected to the second nonvolatile memory device NV2 illustrated in FIG. 4 may also receive the read signal /W and the second control signals A2, B2, C2, and D2 from the control unit 130 and may read the second partial signal S1 stored in the second nonvolatile memory device NV2, and thus the second part I2 of the multi level signal may be output.

Figure 9:
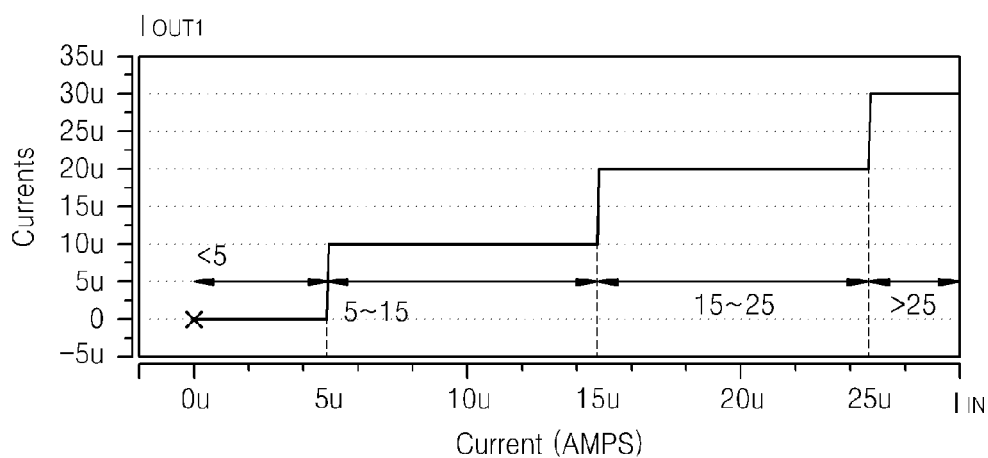
FIG. 9 is a graph showing an input signal input to the multi-valued logic device illustrated in FIG. 3, and a first output signal output from a level restoring unit of the multi-valued logic device.
Figure 10:
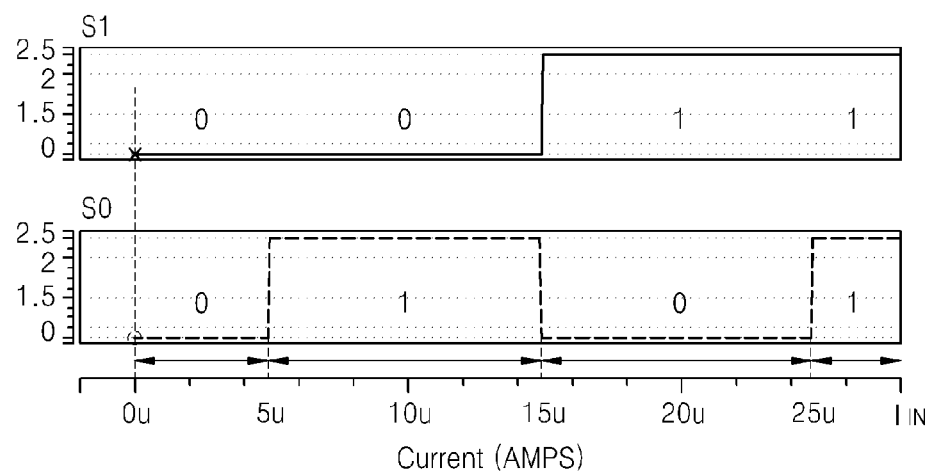
FIG. 10 is a graph showing a second partial signal and a first partial signal stored in the multi-valued logic device illustrated in FIG. 3.

FIG. 9 is a graph showing the input signal $I_{IN}$ input to, for example, the multi-valued logic device 110b illustrated in FIG. 3, and the first output signal $I_{OUT1}$ output from the level restoring unit 140 of the multi-valued logic device 110b. FIG. 10 is a graph showing the second partial signal S1 and the first partial signal S0 stored, for example, the multi-valued logic device 110b illustrated in FIG. 3.

Referring to FIGS. 3 and 9, the level restoring unit 140 may receive the input signal IIN, i.e., a multi level signal, and may output the first output signal $I_{OUT1}$, i.e., a multi level signal corresponding to the input signal $I_{IN}$. Also, referring to FIG. 10, the multi-valued logic device 110b may receive the input signal $I_{IN}$, i.e., a multi level signal, may generate the first and second partial signals S0 and S1 by using the input signal $I_{IN}$, and may store the first and second partial signals S0 and S1 in the first and second nonvolatile memory devices NV1 and NV2.

For example, when the multi-valued logic device 110b is designed to process a multi level signal having four levels (e.g., a multi level signal having four current values of 0 uA, 10 uA, 20 uA, and 30 uA), if the input signal $I_{IN}$ has a current value of about 0-5 uA, the level restoring unit 140 may output the first output signal IOUT1 having a current value of 0 uA. Also, the second partial signal S1 having a value of '0' may be stored as a high resistance in the second nonvolatile memory device NV2, and the first partial signal S0 having a value of '0' may be stored as a high resistance in the first nonvolatile memory device NV1.

If the input signal $I_{IN}$ has a current value of about 5-15 uA, the level restoring unit 140 may output the first output signal $I_{OUT1}$ having a current value of 10 uA. Also, the second partial signal S1 having a value of '0' may be stored as a high resistance in the second nonvolatile memory device NV2, and the first partial signal S0 having a value of '1' may be stored as a low resistance in the first nonvolatile memory device NV1.

If the input signal $I_{IN}$ has a current value of about 15-25 uA, the level restoring unit 140 may output the first output signal IOUT1 having a current value of 20 uA. Also, the second partial signal S1 having a value of '1' may be stored as a low resistance in the second nonvolatile memory device NV2, and the first partial signal S0 having a value of '0' may be stored as a high resistance in the first nonvolatile memory device NV1.

If the input signal IIN has a current value of about greater than 25 uA, the level restoring unit 140 may output the first output signal IOUT1 having a current value of 30 uA. Also, the second partial signal S1 having a value of '1' may be stored as a low resistance in the second nonvolatile memory device NV2, and the first partial signal S0 having a value of '1' may be stored as a low resistance in the first nonvolatile memory device NV1.

As shown in FIGS. 9 and 10, a multi-valued logic device according to an example embodiment may store partial signals having a number of bits (e.g., 1 bit) less than the number of bits (e.g., 2 bits) of a multi level signal, in nonvolatile memory devices. Accordingly, the multi-valued logic device may be easily and reliably implemented by using MLC nonvolatile memory devices each having a small number of bits, or even SLC nonvolatile memory devices.

Figure 11:
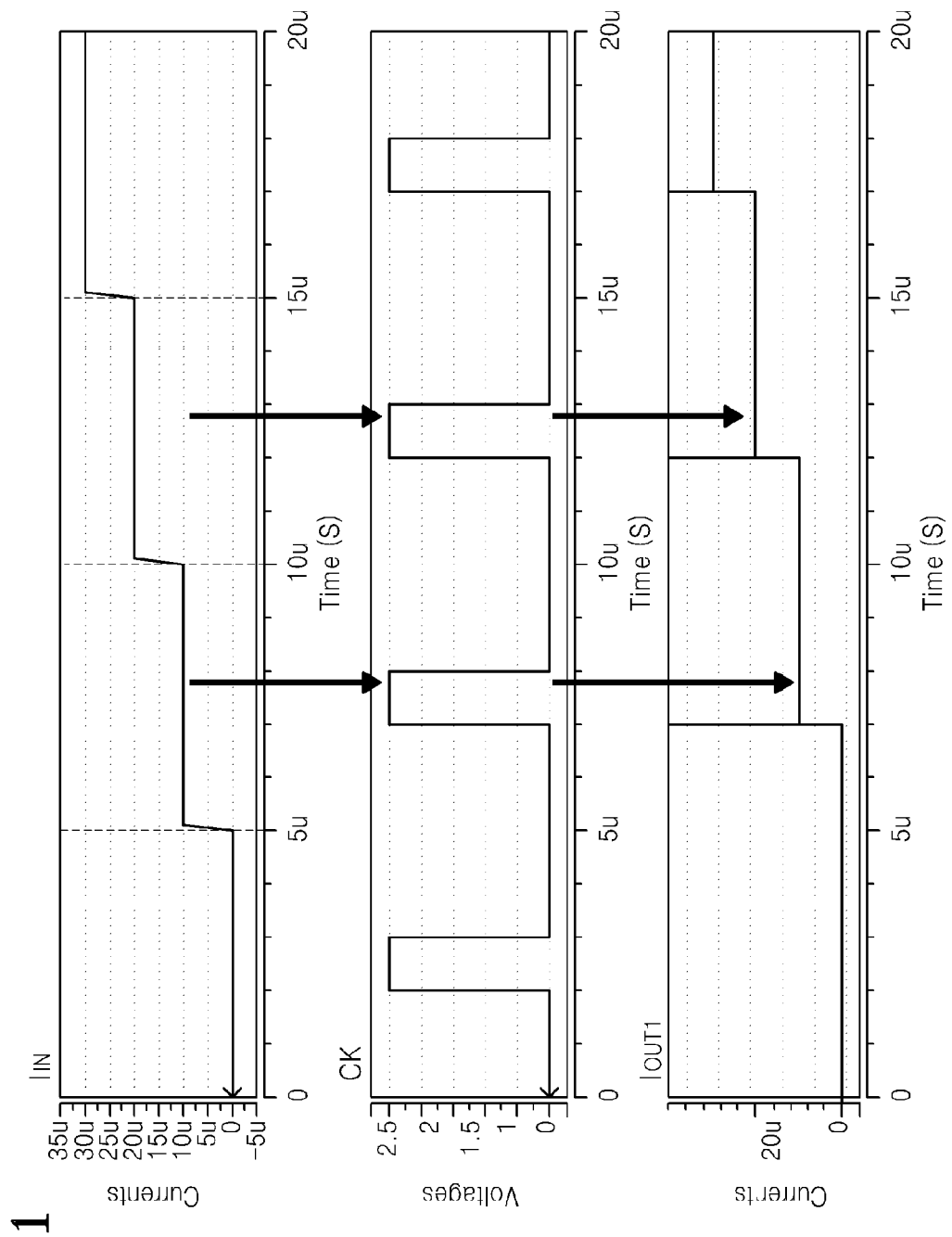
FIG. 11 illustrates graphs showing an input signal (an upper graph) input to the multi-valued logic device illustrated in FIG. 4, a clock signal (a middle graph), and a first output signal (a lower graph) output from a level restoring unit of the multi-valued logic device according to the clock signal.

FIG. 11 illustrates graphs showing the input signal $I_{IN}$ (an upper graph) input to the multi-valued logic device 110c illustrated in FIG. 4, the clock signal CK (a middle graph), and the first output signal $I_{OUT1}$ (a lower graph) output from the level restoring unit 140 of the multi-valued logic device 110c according to the clock signal CK.

Referring to FIGS. 4 and 11, as a current value of the input signal $I_{IN}$ is increased, the level restoring unit 140 may output the first output signal $I_{OUT1}$ having a current value corresponding to that of the input signal $I_{IN}$ at a falling edge of the clock signal CK.

If the input signal $I_{IN}$ has a current value of 0 uA, the input signal $I_{IN}$ is transmitted to the comparison unit 113 according to a first rising edge of the clock signal CK, and the first through third period signals M1 through M3 generated by the comparison unit 113 are stored in the latch 150. After that, the level restoring unit 140 is driven according to a first falling edge of the clock signal CK, and the first output signal $I_{OUT1}$ having a current value of 0 uA may be output from the level restoring unit 140.

Likewise, if the input signal $I_{IN}$ has current values of 10 uA, 20 uA, and 30 uA, the input signal $I_{IN}$ is transmitted to the comparison unit 113 according to rising edges of the clock signal CK, and the first through third period signals M1 through M3 generated by the comparison unit 113 are stored in the latch 150. After that, the level restoring unit 140 is driven according to falling edges of the clock signal CK, and the first output signal $I_{OUT1}$ having current value of 10 uA, 20 uA, and 30 uA may be output from the level restoring unit 140.

As shown in FIG. 11, a multi-valued logic device according to an example embodiment may utilize the first output signal $I_{OUT1}$ (i.e., a multi level signal) output from the level restoring unit 140, for internal use. Furthermore, since the first output signal $I_{OUT1}$ output from the level restoring unit 140 may be transmitted to another logic block (not shown) according to an operation of the clock signal CK, a synchronous operation of the multi-valued logic device may be performed.

Figure 12:
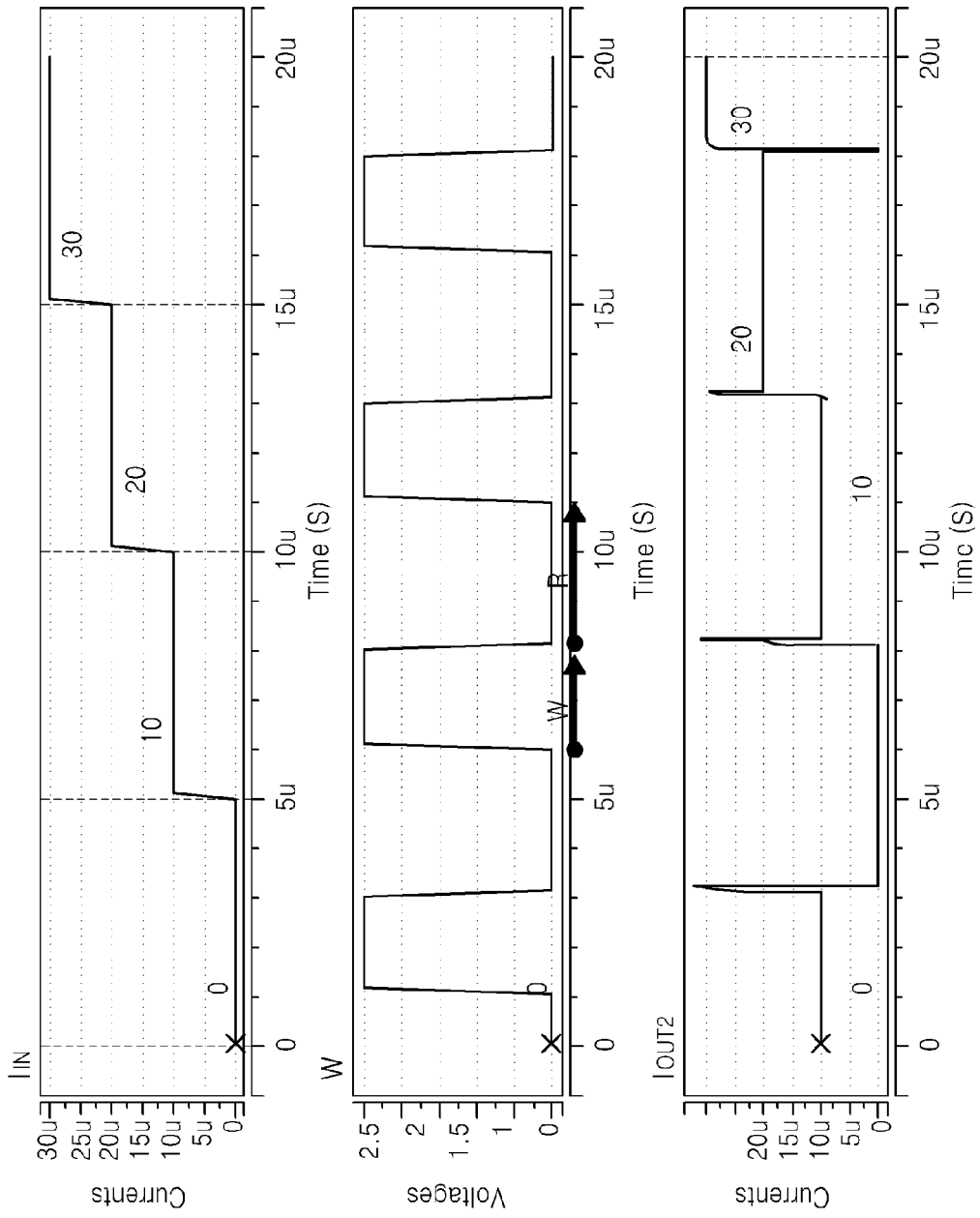
FIG. 12 illustrates graphs showing an input signal (an upper graph) input to the multi-valued logic device illustrated in FIG. 4, write and read signals (a middle graph), and a second output signal (a lower graph) output from a read unit of the multi-valued logic device according to the write and read signals.

FIG. 12 illustrates graphs showing the input signal $I_{IN}$ (an upper graph) input to the multi-valued logic device 110c illustrated in FIG. 4, the write and read signals W and /W (a middle graph), and the second output signal $I_{OUT2}$ (a lower graph) output from the read unit 125 of the multi-valued logic device 110c according to the write and read signals W and /W.

Referring to FIGS. 4 and 12, the read signal /W may be an inversion signal of the write signal W. Accordingly, a write operation is performed if W=1, and a read operation is performed if /W=1.

If the input signal $I_{IN}$ has a current value of 0 uA, while the write signal W is in a first high level (i.e., W=1), the second partial signal S1 having a value of '0' may be stored as a high resistance in the second nonvolatile memory device NV2 by the second voltage applying unit W2. Also, the first partial signal S0 having a value of '0' may be stored as a high resistance in the first nonvolatile memory device NV1 by the first voltage applying unit W1. After that, while the write signal W is in a first low level, the read signal /W is activated (i.e., /W=1), the second partial signal S1 (i.e., '0') and the first partial signal S0 (i.e., '0') stored in the second nonvolatile memory device NV2 (i.e., a high resistance) and the first nonvolatile memory device NV1 (i.e., a high resistance) are respectively read by the second current generating unit R2 and the first current generating unit R1, and thus the second output signal $I_{OUT2}$ having a current value of 0 uA may be output from the output terminal of the read unit 125.

If the input signal $I_{IN}$ has a current value of 10 uA, while the write signal W is in a second high level (i.e., W=1), the second partial signal S1 having a value of '0' may be stored as a high resistance in the second nonvolatile memory device NV2 by the second voltage applying unit W2. Also, the first partial signal S0 having a value of '1' may be stored as a low resistance in the first nonvolatile memory device NV1 by the first voltage applying unit W1. After that, while the write signal W is in a second low level, the read signal /W is activated (i.e., /W=1), and the second partial signal S1 (i.e., '0') and the first partial signal S0 (i.e., '1') stored in the second nonvolatile memory device NV2 (i.e., a high resistance) and the first nonvolatile memory device NV1 (i.e., a low resistance) are respectively read by the second current generating unit R2 and the first current generating unit R1. Thus the second output signal $I_{OUT2}$ having a current value of 10 uA may be output from the output terminal of the read unit 125.

If the input signal $I_{IN}$ has a current value of 20 uA, while the write signal W is in a third high level (i.e., W=1), the second partial signal S1 having a value of '1' may be stored as a low resistance in the second nonvolatile memory device NV2 by the second voltage applying unit W2. Also, the first partial signal S0 having a value of '0' may be stored as a high resistance in the first nonvolatile memory device NV1 by the first voltage applying unit W1. After that, while the write signal W is in a third low level, the read signal /W is activated (i.e., /W=1), and the second partial signal S1 (i.e., '1') and the first partial signal S0 (i.e., '0') stored in the second nonvolatile memory device NV2 (i.e., a low resistance) and the first nonvolatile memory device NV1 (i.e., a high resistance) are respectively read by the second current generating unit R2 and the first current generating unit R1. Thus, the second output signal $I_{OUT2}$ having a current value of 20 uA may be output from the output terminal of the read unit 125.

If the input signal $I_{IN}$ has a current value of 30 uA, while the write signal W is in a fourth high level (i.e., W=1), the second partial signal S1 having a value of '1' may be stored as a low resistance in the second nonvolatile memory device NV2 by the second voltage applying unit W2. Also, the first partial signal S0 having a value of '1' may be stored as a low resistance in the first nonvolatile memory device NV1 by the first voltage applying unit W1. After that, while the write signal W is in a fourth low level, the read signal /W is activated (i.e., /W=1), and the second partial signal S1 (i.e., '1') and the first partial signal S0 (i.e., '1') stored in the second nonvolatile memory device NV2 (i.e., a low resistance) and the first nonvolatile memory device NV1 (i.e., a low resistance) are respectively read by the second current generating unit R2 and the first current generating unit R1. Thus, the second output signal IOUT2 having a current value of 30 uA may be output from the output terminal of the read unit 125.

As shown in FIG. 12, a multi-valued logic device according to an example embodiment may store a multi level signal by using MLC nonvolatile memory devices each having a small number of bits, and may output the multi level signal at a desired timing.

Figure 13:
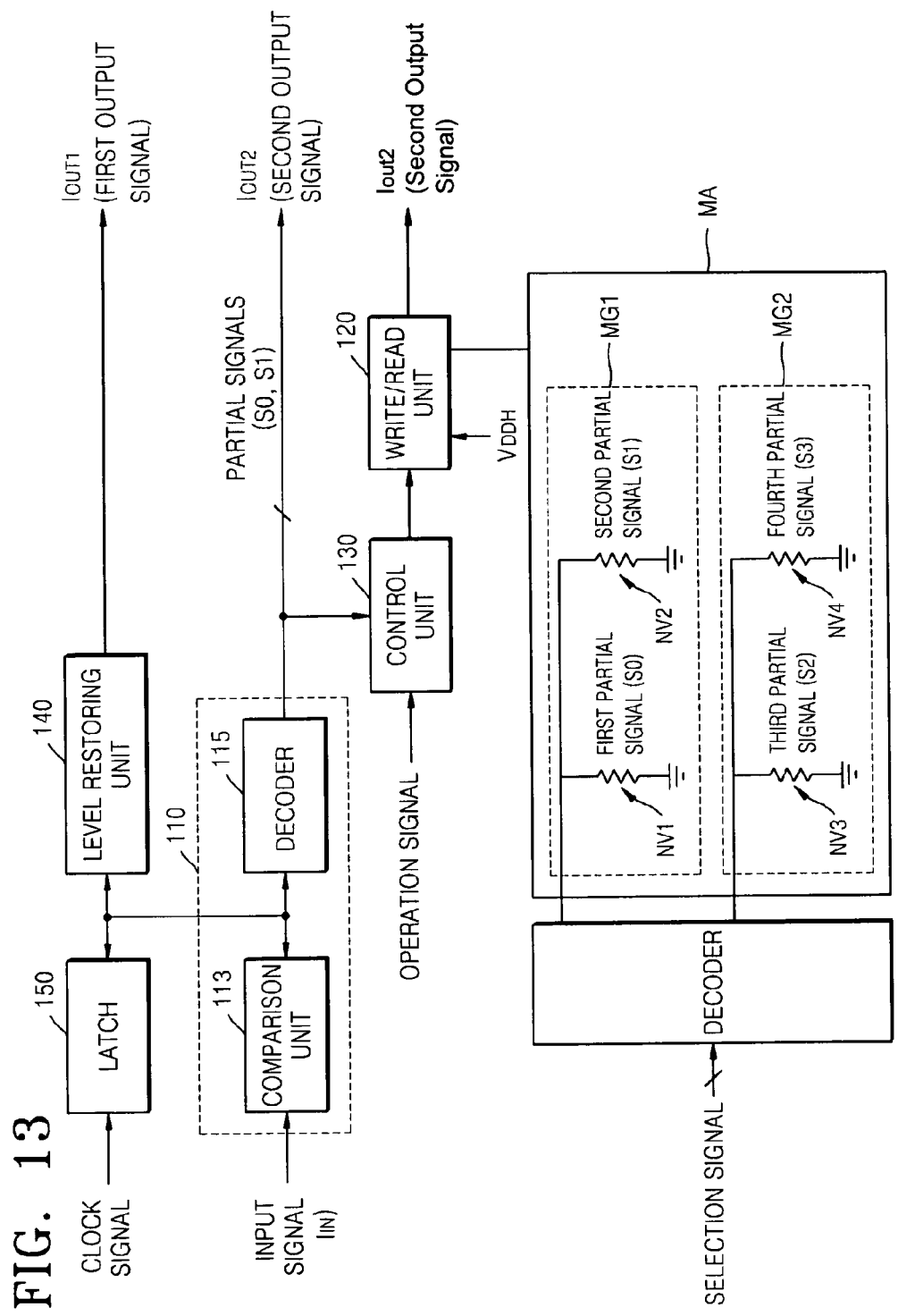
FIG. 13 is a block diagram of a multi-valued logic device according to another example embodiment.

FIG. 13 is a block diagram of a multi-valued logic device according to another example embodiment. The multi-valued logic device according to an example embodiment may be modified from the multi-valued logic device 100b illustrated in FIG. 3. Repeated descriptions will not be provided here.

Referring to FIG. 13, the multi-valued logic device may further include a nonvolatile memory array MA in which a plurality of nonvolatile memory devices, e.g., first through fourth nonvolatile memory devices NV1 through NV4, are aligned in an array.

The nonvolatile memory array MA may include a plurality of nonvolatile memory device groups, e.g., first and second nonvolatile memory device groups MG1 and MG2. The first and second nonvolatile memory device groups MG1 and MG2 may respectively store first and second partial signals S0 and S1 corresponding to first and second parts of a first multi level signal, and third and fourth partial signals S2 and S3 corresponding to first and second parts of a second multi level signal. The first and second nonvolatile memory device groups MG1 and MG2 in the nonvolatile memory array MA may be selected according to a selection signal (e.g., an address signal).

For example, the first and second nonvolatile memory devices NV1 and NV2 may be used to store the first and second parts of the first multi level signal having a current value of 10 uA in a multi level signal having four levels (e.g., a multi level signal having four current values of 0 uA, 10 uA, 20 uA, and 30 uA). In this case, the first nonvolatile memory device group MG1 including the first and second nonvolatile memory devices NV1 and NV2 may be selected according to a selection signal. A write operation is performed, and thus the second nonvolatile memory device NV2 may be in a high resistance state (i.e., may store the second partial signal S1 having a value of '0') and the first nonvolatile memory device NV1 may be in a low resistance state (i.e., may store the first partial signal S0 having a value of '1').

Also, the third and fourth nonvolatile memory devices NV3 and NV4 may be used to store the first and second parts of the second multi level signal having a current value of 30 uA in a multi level signal having four levels (e.g., a multi level signal having four current values of 0 uA, 10 uA, 20 uA, and 30 uA). In this case, the second nonvolatile memory device group MG2 including the third and fourth nonvolatile memory devices NV3 and NV4 may be selected according to a selection signal. A write operation is performed, and thus the fourth nonvolatile memory device NV4 may be in a low resistance state (i.e., may store the fourth partial signal S3 having a value of '1') and the third nonvolatile memory device NV3 may be in a high resistance state (i.e., may store the third partial signal S2 having a value of '0').

Figure 14:
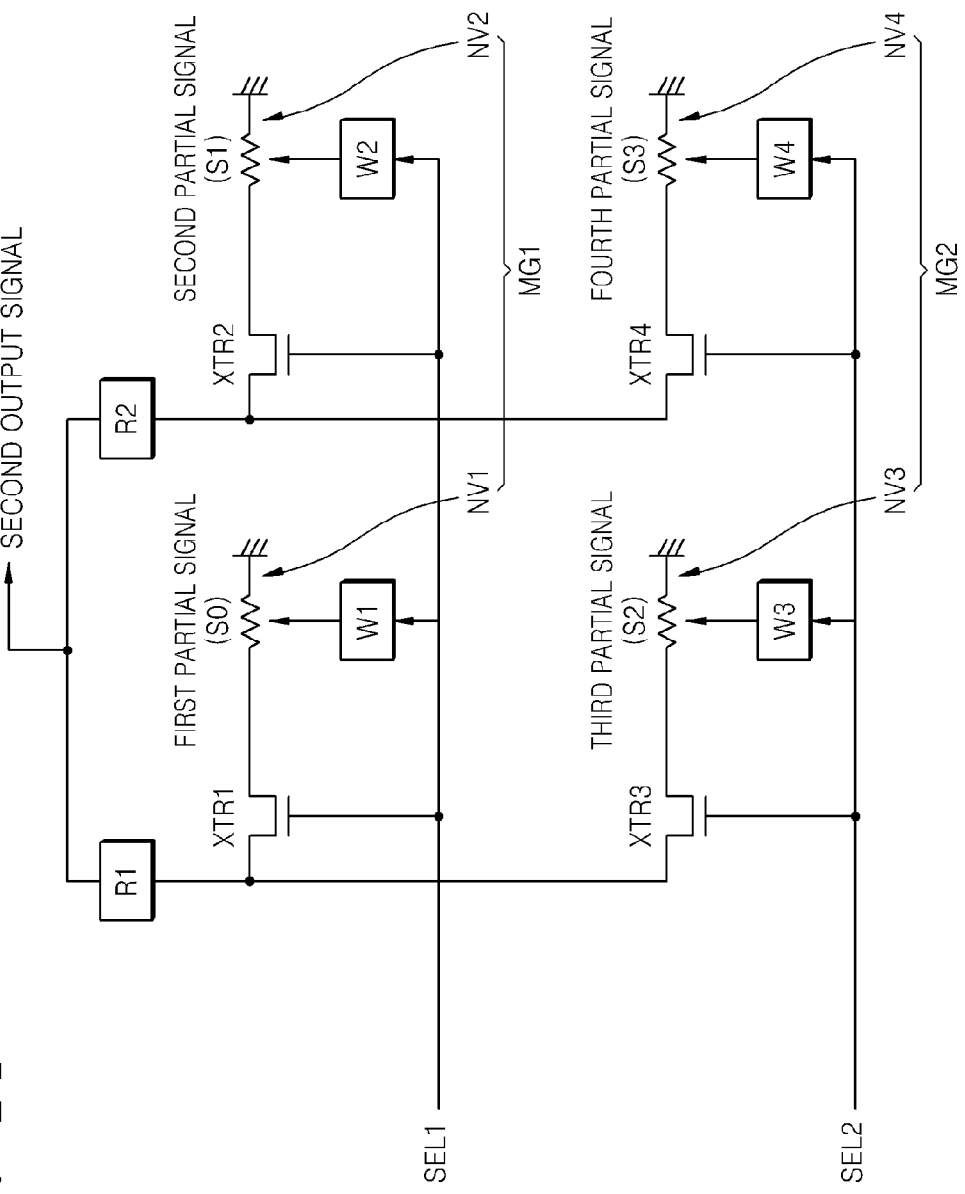
FIG. 14 is a circuit diagram of a multi-valued logic device according to another example embodiment.

FIG. 14 is a circuit diagram of a multi-valued logic device according to another example embodiment. The multi-valued logic device according to an example embodiment may be modified from the multi-valued logic device illustrated in FIG. 13. Repeated descriptions will not be provided here.

Referring to FIG. 14, the multi-valued logic device may store first and second multi level signals according to a write signal, may select one of the first and second multi level signals according to a selection signal, and may output a selected multi level signal according to a read signal. For this, the multi-valued logic device may include a plurality of nonvolatile memory devices (e.g., the first through fourth nonvolatile memory devices NV1 through NV4), the write unit 123, and the read unit 125. These elements are described in detail above in relation to FIGS. 1 through 13, and thus will not be described here.

The write unit 123 may be configured to respectively store the first through fourth partial signals S0 through S3 in the first through fourth nonvolatile memory devices NV1 through NV4 according to a write signal and a selection signal.

For example, in order to store the first multi level signal (e.g., a signal having a current value of 0 uA), a first selection signal line SEL1 may be activated and thus first and second voltage applying units W1 and W2 may operate.

In this case, the first nonvolatile memory device NV1 of the first nonvolatile memory device group MG1 may store the first partial signal S0 (e.g., '0') corresponding to a first part of the first multi level signal, and the second nonvolatile memory device NV2 of the first nonvolatile memory device group MG1 may store the second partial signal S1 (e.g., '0') corresponding to a second part of the first multi level signal.

Also, in order to store the second multi level signal (e.g., a signal having a current value of 40 uA), a second selection signal line SEL2 may be activated and thus third and fourth voltage applying units W3 and W4 may operate.

In this case, the third nonvolatile memory device NV3 of the second nonvolatile memory device group MG2 may store the third partial signal S2 (e.g., '1') corresponding to a first part of the second multi level signal, and the fourth nonvolatile memory device NV4 of the second nonvolatile memory device group MG2 may store the fourth partial signal S3 (e.g., '1') corresponding to a second part of the second multi level signal.

As described above in relation to FIGS. 1 and 2, the number of bits of each of the first and second partial signals S0 and S1 is less than the number of bits of the first multi level signal. Likewise, the number of bits of each of the third and fourth partial signals S2 and S3 is less than the number of bits of the second multi level signal. Accordingly, the multi-valued logic device may be easily and reliably implemented.

The first and second selection signal lines SEL1 and SEL2 may be connected to each other, and the first or second selection signal line SEL1 or SEL2 may be activated according to a level of a selection signal. That is, the first selection signal line SEL1 may be activated if the selection signal is in a first state, and the second selection signal line SEL2 may be activated if the selection signal is in a second state.

The read unit 125 may be configured to output, according to a read signal, one of the first and second multi level signals selected according to the selection signal.

The first current generating unit R1 of the read unit 125 may be configured to output the first part of the first multi level signal or the first part of the second multi level signal based on the first partial signal S0 stored in the first nonvolatile memory device NV1 or the third partial signal S2 stored in the third nonvolatile memory device NV3. Also, the second current generating unit R2 of the read unit 125 may be configured to output the second part of the first multi level signal or the second part of the second multi level signal based on the second partial signal S1 stored in the second nonvolatile memory device NV2 or the fourth partial signal S3 stored in the fourth nonvolatile memory device NV4.

For example, in order to output the first multi level signal (e.g., a signal having a current value of 0 uA), the first selection signal line SEL1 may be activated. Here, the first and second nonvolatile memory devices NV1 and NV2 of the first nonvolatile memory device group MG1 may be read.

In this case, the first current generating unit R1 may output the first part (i.e., 0 uA) of the first multi level signal based on the first partial signal S0 (e.g., '0') stored in the first nonvolatile memory device NV1, and the second current generating unit R2 may output the second part (i.e., 0 uA) of the first multi level signal based on the second partial signal S1 (i.e., '0') stored in the second nonvolatile memory device NV2.

Meanwhile, in order to output the second multi level signal (e.g., a signal having a current value of 30 uA), the second selection signal line SEL2 may be activated. Here, the third and fourth nonvolatile memory devices NV3 and NV4 of the second nonvolatile memory device group MG2 may be read.

In this case, the first current generating unit R1 may output the first part (i.e., 10 uA) of the second multi level signal based on the third partial signal S2 (e.g., '1') stored in the third nonvolatile memory device NV3, and the second current generating unit R2 may output the second part (i.e., 20 uA) of the second multi level signal based on the fourth partial signal S3 (i.e., '1') stored in the fourth nonvolatile memory device NV4.

In at least one example embodiment, nonvolatile memory devices may be resistive memory cells such as phase-change random access memory (PRAM) or resistive random access memory (RRAM) cells, or may be nano floating gate memory (NFGM), polymer random access memory (PoRAM), magnetic random access memory (MRAM), ferroelectric random access memory (FeRAM), or flash memory cells. Furthermore, although a multi-valued logic device using nonvolatile memory devices is described above, example embodiments are not limited thereto. That is, instead of nonvolatile memory devices, a multi-valued logic device may use volatile memory cells such as dynamic random access memory (DRAM) or static random access memory (SRAM) cells.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A multi-valued logic device comprising:
   a conversion unit configured to convert a multi level signal into a plurality of partial signals; and
   a plurality of nonvolatile memory devices configured to individually store the plurality of partial signals,
   wherein a number of bits of each of the plurality of partial signals individually stored in the plurality of nonvolatile memory devices is less than a number of bits of the multi level signal.

2. The multi-valued logic device of claim 1, wherein each of the plurality of partial signals is a 1-bit signal, and each of the plurality of nonvolatile memory devices is a single level cell (SLC) nonvolatile memory device configured to store the 1-bit signal.

3. The multi-valued logic device of claim 1, further comprising:
   a write unit configured to store the plurality of partial signals individually in the plurality of nonvolatile memory devices according to a write signal.

4. The multi-valued logic device of claim 3, further comprising:
   a control unit configured to generate the write signal and transmit the write signal to the write unit, the write signal varying resistances of the plurality of nonvolatile memory devices based on the plurality of partial signals.

5. The multi-valued logic device of claim 3, wherein the write unit includes a plurality of voltage applying units connected to the plurality of nonvolatile memory devices, and
   the plurality of voltage applying units are configured to individually vary resistances of the plurality of nonvolatile memory devices.

6. The multi-valued logic device of claim 5, wherein each of the plurality of voltage applying units includes:
   a first state voltage applying unit configured to vary a resistance of each of the plurality of nonvolatile memory devices to a first state; and
   a second state voltage applying unit configured to vary the resistance of each of the plurality of nonvolatile memory devices to a second state.

7. The multi-valued logic device of claim 1, further comprising:
   a read unit configured to output the multi level signal according to a read signal.

8. The multi-valued logic device of claim 7, wherein the read unit includes a plurality of current generating units individually connected to the plurality of nonvolatile memory devices, and each of the plurality of current generating units is configured to output a part of the multi level signal based on each of the plurality of partial signals stored in the plurality of nonvolatile memory devices.

9. The multi-valued logic device of claim 8, wherein each of the plurality of current generating units is connected between an output terminal of the read unit and each of the plurality of nonvolatile memory devices.

10. The multi-valued logic device of claim 9, wherein each of the plurality of current generating units includes a current mirror circuit configured to output the part of the multi level signal based on a current flowing in each of the plurality of nonvolatile memory devices.

11. The multi-valued logic device of claim 1, wherein the plurality of nonvolatile memory devices are aligned in an array.

12. The multi-valued logic device of claim 1, wherein the conversion unit includes:
   a comparison unit configured to generate a plurality of period signals, the period signals corresponding to boundaries between levels of the multi level signal; and
   a decoder configured to generate the plurality of partial signals based on the plurality of period signals.

13. The multi-valued logic device of claim 12, wherein the plurality of partial signals are binary signals, and the decoder includes a binary decoder configured to generate the binary signals based on the plurality of period signals.

14. The multi-valued logic device of claim 12, further comprising:
   a level restoring unit configured to restore and output the multi level signal using the plurality of period signals.

15. The multi-valued logic device of claim 14, wherein the level restoring unit is configured to activate according to a clock signal so as to output the multi level signal.

16. The multi-valued logic device of claim 14, wherein the level restoring unit includes a current mirror circuit configured to output the multi level signal based on a current flowing according to the plurality of period signals.

17. The multi-valued logic device of claim 1, further comprising:
a write unit configured to store the plurality of partial signals in the plurality of nonvolatile memory devices;
a read unit configured to combine the plurality of partial signals to output the multi level signal; and a control unit configured to control the write unit and the read unit based on the plurality of partial signals.

18. The multi-valued logic device of claim 17, wherein the write unit is configured to vary resistances of the plurality of nonvolatile memory devices based on the plurality of partial signals.

19. A multi-valued logic device comprising:
a first nonvolatile memory device configured to store a first partial signal corresponding to a first part of a multi level signal; and
a second nonvolatile memory device configured to store a second partial signal corresponding to a second part of the multi level signal,
wherein a number of bits of each of the first and second partial signals is less than a number of bits of the multi level signal.

20. The multi-valued logic device of claim 19, wherein each of the first and second partial signals is a 1-bit signal, and each of the first and second nonvolatile memory devices is a single level cell (SLC) nonvolatile memory device configured to store the 1-bit signal.

21. The multi-valued logic device of claim 19, further comprising:
a conversion unit configured to convert the multi level signal into the first and second partial signals; and
a write unit configured to store the first and second partial signals individually in the first and second nonvolatile memory devices according to a write signal.

22. The multi-valued logic device of claim 21, wherein the write unit includes:
a first voltage applying unit configured to store the first partial signal in the first nonvolatile memory device; and
a second voltage applying unit configured to store the second partial signal in the second nonvolatile memory device.

23. The multi-valued logic device of claim 22, wherein the first voltage applying unit includes,
a first set voltage applying unit configured to vary a resistance of the first nonvolatile memory device into a set resistance; and
a first reset voltage applying unit configured to vary the resistance of the first nonvolatile memory device into a reset resistance, and
the second voltage applying unit includes,
a second set voltage applying unit configured to vary a resistance of the second nonvolatile memory device into the set resistance; and
a second reset voltage applying unit configured to vary the resistance of the second nonvolatile memory device into the reset resistance.

24. The multi-valued logic device of claim 23, wherein
if the first partial signal is in a low state, then the first reset voltage applying unit is activated and the resistance of the first nonvolatile memory device is varied into the reset resistance,
if the first partial signal is in a high state, the first set voltage applying unit is activated and the resistance of the first nonvolatile memory device is varied into the set resistance,
if the second partial signal is in the low state, the second reset voltage applying unit is activated and the resistance of the second nonvolatile memory device is varied into the reset resistance, and
if the second partial signal is in the high state, the second set voltage applying unit is activated and the resistance of the second nonvolatile memory device is varied into the set resistance.

25. The multi-valued logic device of claim 19, further comprising:
a read unit configured to output the multi level signal according to a read signal.

26. The multi-valued logic device of claim 25, wherein the read unit comprises:
a first current generating unit configured to output the first part of the multi level signal based on the first partial signal stored in the first nonvolatile memory device; and
a second current generating unit configured to output the second part of the multi level signal based on the second partial signal stored in the second nonvolatile memory device.

27. The multi-valued logic device of claim 26, wherein
the first current generating unit is connected between an output terminal of the read unit and the first nonvolatile memory device, and
the second current generating unit is connected between the output terminal of the read unit and the second nonvolatile memory device.

28. The multi-valued logic device of claim 27, wherein
the first current generating unit includes a first current mirror circuit configured to output the first part of the multi level signal based on a current flowing in the first nonvolatile memory device, and
the second current generating unit includes a second current mirror circuit configured to output the second part of the multi level signal based on a current flowing in the second nonvolatile memory device.

29. A multi-valued logic device comprising:
a first nonvolatile memory device configured to store a first partial signal corresponding to a first part of a first multi level signal;
a second nonvolatile memory device configured to store a second partial signal corresponding to a second part of the first multi level signal,
a third nonvolatile memory device configured to store a third partial signal corresponding to a first part of a second multi level signal; and
a fourth nonvolatile memory device configured to store a fourth partial signal corresponding to a second part of the second multi level signal, wherein a number of bits of each of the first and second partial signals is less than a number of bits of the first multi level signal, and a number of bits of each of the third and fourth partial signals is less than a number of bits of the second multi level signal.

30. The multi-valued logic device of claim 29, wherein the first through fourth nonvolatile memory devices are aligned in an array.

31. The multi-valued logic device of claim 29, further comprising:
  a write unit configured to store the first through fourth partial signals individually in the first through fourth nonvolatile memory devices according to a write signal and a selection signal.

32. The multi-valued logic device of claim 31, wherein the write unit is configured to store the first and second partial signals individually in the first and second nonvolatile memory devices if the selection signal is in a first state, and store the third and fourth partial signals individually in the third and fourth nonvolatile memory devices if the selection signal is in a second state.

33. The multi-valued logic device of claim 29, further comprising:
  a read unit configured to output one of the first and second multi level signals according to a selection signal and according to a read signal.

34. The multi-valued logic device of claim 33, wherein the read unit comprises:
  a first current generating unit configured to output the first part of the first multi level signal or the first part of the second multi level signal based on the first partial signal stored in the first nonvolatile memory device or the third partial signal stored in the third nonvolatile memory device; and
  a second current generating unit configured to output the second part of the first multi level signal or the second part of the second multi level signal based on the second partial signal stored in the second nonvolatile memory device or the fourth partial signal stored in the fourth nonvolatile memory device.

35. The multi-valued logic device of claim 34, wherein
  if the selection signal is in a first state, then the first current generating unit outputs the first part of the first multi level signal based on the first partial signal stored in the first nonvolatile memory device, and the second current generating unit outputs the second part of the first multi level signal based on the second partial signal stored in the second nonvolatile memory device, and
  if the selection signal is in a second state, then the first current generating unit outputs the first part of the second multi level signal based on the third partial signal stored in the third nonvolatile memory device, and the second current generating unit outputs the second part of the second multi level signal based on the fourth partial signal stored in the fourth nonvolatile memory device.

* * * * *